United States Patent
Kushibe et al.

(10) Patent No.: US 11,714,936 B2
(45) Date of Patent: Aug. 1, 2023

(54) OPTIMIZATION APPARATUS, OPTIMIZATION METHOD, AND NON-TRANSITORY COMPUTER-READABLE STORAGE MEDIUM FOR STORING OPTIMIZATION PROGRAM

(71) Applicant: FUJITSU LIMITED, Kawasaki (JP)

(72) Inventors: Daisuke Kushibe, Kawasaki (JP); Hirotaka Tamura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 407 days.

(21) Appl. No.: 17/152,831

(22) Filed: Jan. 20, 2021

(65) Prior Publication Data

US 2021/0286919 A1    Sep. 16, 2021

(30) Foreign Application Priority Data

Mar. 13, 2020  (JP) .................. 2020-044471

(51) Int. Cl.
*G06F 30/20* (2020.01)
*G06N 7/08* (2006.01)

(52) U.S. Cl.
CPC ............... *G06F 30/20* (2020.01); *G06N 7/08* (2013.01)

(58) Field of Classification Search
CPC .................. G06F 30/20; G06N 7/08
See application file for complete search history.

(56) References Cited

U.S. PATENT DOCUMENTS

| | | |
|---|---|---|
| 2004/0032786 A1 | 2/2004 | Ugajin et al. |
| 2005/0098773 A1 | 5/2005 | Vion et al. |
| 2016/0063391 A1* | 3/2016 | Hayashi ................ G06F 7/588 706/11 |
| 2016/0064053 A1 | 3/2016 | Yamaoka et al. |
| 2016/0065210 A1 | 3/2016 | Yoshimura et al. |
| 2017/0220924 A1* | 8/2017 | Danjo ..................... G06N 7/01 |

(Continued)

FOREIGN PATENT DOCUMENTS

| | | |
|---|---|---|
| JP | 2003-124543 A | 4/2003 |
| JP | 2007-516610 A | 6/2007 |
| JP | 2009-070348 A | 4/2009 |

(Continued)

OTHER PUBLICATIONS

De Grandi C, Polkovnikov A, Sandvik AW. Universal nonequilibrium quantum dynamics in imaginary time. Physical Review B. Dec. 14, 2011;84(22):224303. (Year: 2011).*

(Continued)

*Primary Examiner* — Chuen-Meei Gan

(74) *Attorney, Agent, or Firm* — Fujitsu Patent Center

(57) ABSTRACT

An optimization method executed by a computer upon attempting to solve a ground state of an Ising model by simulating a state change of the Ising model when a magnetic field applied to the Ising model is reduced, the Ising model representing a problem to be solved, the method including: executing a first process, the first process being a real time propagation in which an intensity of the magnetic field is reduced with progress of time in simulation; and in response to the progress of time in the real time propagation of the first process, executing a second process, the second process including reducing energy of the Ising model based on an imaginary time propagation method.

5 Claims, 13 Drawing Sheets

(56) References Cited

U.S. PATENT DOCUMENTS

| | | | |
|---|---|---|---|
| 2019/0235033 A1 | 8/2019 | Ohzeki | |
| 2020/0090071 A1* | 3/2020 | Franzke | G06N 7/01 |

FOREIGN PATENT DOCUMENTS

| | | |
|---|---|---|
| JP | 2016-051314 A | 4/2016 |
| JP | 2018-067200 A | 4/2018 |

OTHER PUBLICATIONS

Liu CW, Polkovnikov A, Sandvik AW. Quasi-adiabatic quantum Monte Carlo algorithm for quantum evolution in imaginary time. Physical Review B. May 23, 2013;87(17):174302. (Year: 2013).*

Motta M, Sun C, Teck Keng Tan A, O'rourke MJ, Ye E, Minnich AJ, Brandao FG, Kin-Lie Chan G. Quantum imaginary time evolution, quantum lanczos, and quantum thermal averaging. arXiv. Jan. 2019:arXiv-1901. (Year: 2019).*

Tsukamoto S, Takatsu M, Matsubara S, Tamura H. An accelerator architecture for combinatorial optimization problems. Fujitsu Sci. Tech. J. Sep. 1, 2017;53(5):8-13. (Year: 2017).*

Extended European Search Report dated Jul. 9, 2021 for corresponding European Patent Application No. 21151553.1, 9 pages.

De Grandi, C. et al., "Universal non-equilibrium quantum dynamics in imaginary time", arxiv.org, Cornell University Library, 201 Olin Library Cornell University Ithaca, NY 14853, XP080510436, DOI: 10.1103/PHYSREVB.84.224303, pp. 1-8, Jun. 21, 2011.

Sanroku Tsukamoto et al., "An Accelerator Architecture for Combinatorial Optimization Problems", FUJITSU Sci. Tech. J., vol. 53, No. 5, pp. 8-13, Sep. 2017 (Total 6 pages).

S. Kirkpatrick et al., "Optimization by Simulated Annealing", STOR Science, New Series, vol. 220, No. 4598, pp. 671-680, May 13, 1983 (Total 11 pages).

Koji Hukushima et al., "Exchange Monte Carlo Method and Application to Spin Glass Simulations", Journal of the Physical Society of Japan, vol. 65, No. 6, pp. 1604-1608, Jun. 1996 (Total 5 pages).

E. D. Dahl, "Programming with D-Wave: Map Coloring Problem", D-Wave Systems, Whitepaper, pp. 1-12, Nov. 2013 (Total 12 pages).

Tadashi Kadowaki et al., "Quantum Annealing in the Transverse Ising Model", Physical Review E, vol. 58, No. 5, pp. 5355-5363, Nov. 1998, The American Physical Society (Total 9 pages).

Hidetoshi Nishimori et al., "Exponential Enhancement of the Efficiency of Quantum Annealing by Non-Stoquastic Hamiltonians", Frontiers in ICT, vol. 4, Article 2, pp. 1-11, Feb. 17, 2017, Hypothesis and Theory (Total 11 pages).

Tameem Albash et al., "Demonstration of a scaling Advantage for a quantum Annealer Over Simulated Annealing", arXiv:1705.07452v3, pp. 1-28, Aug. 6, 2018(Total 28 pages).

J. R. Abo-Shaeer et al., "Observation of Vortex Lattices in Bose-Einstein Condensates", Science, vol. 292, Issue 5516, pp. 476-479, Apr. 20, 2001 (Total 4 pages).

Masaki Mutou et al., "Numerical Simulation of Quantized Vortices in 2-Dimensional Bose-Einstein Condensates", The Fifth Asian International Seminar on Atomic and Molecular Physics, AISAMP 5, pp. 202-203, Oct. 2-5, 2002 (Total 13 pages).

Naomichi Hatano et al., "Finding Exponential Product Formulas of Higher Orders", Quantum Annealing and Other Optimization Methods, Lect. Notes Phys. 679, Springer-Verlag Beriin Heidelberg, pp. 37-68, Nov. 16, 2005 (Total 32 pages).

Mikio Nakahara et al., "Solution to Traveling Salesman Problem based on Adiabatic Quantum Computing", Kinki University (Kindai) Research Institute Report 29, pp. 1-9, Feb. 28, 2017 (Total 21 pages).

* cited by examiner

OPTIMIZATION APPARATUS, OPTIMIZATION METHOD, AND NON-TRANSITORY COMPUTER-READABLE STORAGE MEDIUM FOR STORING OPTIMIZATION PROGRAM

CROSS-REFERENCE TO RELATED APPLICATION

This application is based upon and claims the benefit of priority of the prior Japanese Patent Application No. 2020-44471, filed on Mar. 13, 2020, the entire contents of which are incorporated herein by reference.

FIELD

The embodiments discussed herein are related to an optimization apparatus, an optimization method, and a non-transitory computer-readable storage medium storing an optimization program.

BACKGROUND

As a problem that frequently occurs in natural science and social science, there is a minimum value solution problem (or referred to as a combination optimization problem) of obtaining a minimum value (or a combination of values of state variables of an evaluation function giving a minimum value) of an evaluation function (also referred to as an energy function). In recent years, the movement of formulating such a problem by using the Ising model that is a model indicating behaviors of spins of magnetic substances has been accelerated.

A solution method that is often used is a method in which a stochastic process is introduced by using a Markov chain Monte Carlo (MCMC) method, a temperature is introduced after a specific distribution such as a Boltzmann distribution is defined, and the temperature is lowered in a simulation manner. This solution method is called a simulated annealing (SA) method. However, in order to reach an exact solution in the SA method, a temperature schedule is taken as a reciprocal of a logarithm with respect to time. In other words, when cooling is performed at a high speed, the solution does not necessarily reach an optimum solution.

Under such circumstances, in recent years, the movement of developing computation techniques and computers based on quantum mechanics has become active. A technical basis of this movement is implementation of Ising type quantum computers. In the Ising type quantum computer, a quantum annealing (QA) method is a theoretical basis. It is expected that a quantum computer may solve a problem that is difficult for a classical computer based on an electronic circuit that is generally used to solve in a realistic computation time. At this stage, all problems may not be solved at high speed by the quantum computer, but it is expected that some problems may be solved by the quantum computer at high speed. A representative problem is an integer factoring problem that is a basis of encrypted communication such as RSA encryption. As described above, since the Ising type quantum computer is implemented, the movement of retrieving an application range of the quantum computer is accelerated.

Examples of the related art include Japanese Laid-open Patent Publication No. 2018-067200, Japanese Laid-open Patent Publication No. 2016-051314, and some non-patent literatures, such as: [NPL 1] Sanroku Tsukamoto, Motomu Takatsu, Satoshi Matsubara and Hirotaka Tamura, "An Accelerator Architecture for Combinatorial Optimization Problems", FUJITSU Sci. Tech. 3. Vol. 53, No. 5, pp. 8 to 13, September 2017; [NPL 2] S. Kirkpatrick, C. D. Gelatt, M. P. Vecchi, "Optimization by Simulated Annealing", Science, Vol. 220, No. 4598, pp. 671 to 680, 13, May, 1983; [NPL 3] Koji Hukushima and Koji Nernoto, "Exchange Monte Carlo Method and Application to Spin Glass Simulations", Journal of the Physical Society of Japan, Volume 65, No. 6, pp. 1604 to 1608, June, 1996; [NPL 4] E. D. Dahl, "Programming with D-Wave: Map Coloring Problem", D-Wave Systems whitepaper, November 2013; [NPL 5] Tadashi Kadowaki and Hidetoshi Nishimori, "Quantum annealing in the transverse Ising model", Phys. Rev. E, 58, No. 5, 5355, November 1998; [NPL 6] Hidetoshi Nishimori and Kabuki Takada, "Exponential Enhancement of the Efficiency of Quantum Annealing by Non-Stoquastic Hamiltonians", frontiers in ICT, Volume 4, Article 2, February 2017; [NPL 7] T. Albash and D, A. Lidar, "Demonstration of a scaling advantage for a quantum annealer over simulated annealing", arXiv:1705.07452v3, 6 Aug. 2018; [NPL 8] J. R. Abo-Shaeer, C. Raman, J. M. Vogels, VII. Ketterle, "Observation of Vortex Lattices in Bose-Einstein Condensates", Science, Vol. 292, Issue 5516, pp. 476 to 479, 20 Apr. 2001; [NPL 9] Masaki Mutou, Tow Morishita, Daisuke Kushibe, Shinichi Watanabe, and Michio Matsuzawa, "Numerical simulation of quantized vortices in 2-Dimensional Bose-Einstein Condensates", The Fifth Asian International Seminar on Atomic and Molecular Physics, 202 to 203, October 2002; [NPL 10] Naomichi Hatano and Masuo Suzuki, "Finding Exponential Product Formulas of Higher Orders", Quantum Annealing and Other Optimization Methods, pp. 37 to 68, 16 Nov. 2005; and [NPL 11] Mikio Nakahara, Masamitsu Bando, Shu Tanaka, "Solution to Traveling Salesman Problem based on Adiabatic Quantum Computing", Kindai University Research Institute Report 29, 1 to 9, 28 Feb. 2017.

SUMMARY

According to an aspect of the embodiments, provided is an optimization method executed by a computer upon attempting to solve a ground state of an Ising model by simulating a state change of the Ising model when a magnetic field applied to the Ising model is reduced, the Ising model representing a problem to be solved. In an example, the method includes: executing a first process, the first process being a real time propagation in which an intensity of the magnetic field is reduced with progress of time in simulation; and in response to the progress of time in the real time propagation of the first process, executing a second process, the second process including reducing energy of the Ising model based on an imaginary time propagation method.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In a minimum value solution problem defined by N (where N is an integer of 1 or greater) binary variables, a problem of obtaining a ground state (optimum value) of a system and a wave function of the ground state (a combination of state variables at the optimum value) by performing computation based on the principle of quantum mechanics is considered. Here, the system refers to a partial space considered separately from the surrounding environment. When this problem is converted into an Ising model, it is possible to solve the problem by using the Hamiltonian in the QA method. An apparatus that solves the minimum value solution problem is referred to as an optimization apparatus.

In solution retrieval using the QA method, the optimization apparatus sets a state in which a transverse magnetic field is applied to N spins as an initial state. The optimization apparatus prepares a quantum state that may be experimentally prepared as an initial state. The optimization apparatus weakens a transverse magnetic field from the state with the passage of time. Then, finally, the transverse magnetic field completely disappears, and a ground state of the Hamiltonian to be solved, that is, an energy minimum value is obtained.

However, in the solution retrieval using the QA method, in order to suppress the occurrence of a phenomenon called first-order quantum phase transition, a strong restriction is imposed on weakening of a transverse magnetic field. In other words, the optimization apparatus may suppress the occurrence of the first-order quantum phase transition by delaying the weakening of the transverse magnetic field. However, when the weakening of the transverse magnetic field is delayed in order to suppress the occurrence of the first-order quantum phase transition, a solution retrieval time in the minimum value solution problem is increased.

In an aspect of the embodiments, provided is a solution to efficiently obtain a ground state of the Ising model.

Hereinafter, the present embodiments will be described with reference to the drawings. In addition, two or more of the embodiments may be combined and implemented without any contradiction.

First Embodiment

A first embodiment is an optimization method of expanding time in a quantum mechanical time propagation operator to a complex number in order to incorporate an effect of thermal dissipation, and realizing the thermal dissipation based on an imaginary time propagation method. The thermal dissipation mechanism is introduced, and thus relaxation to a ground state may occur without strictly observing the adiabatic transition condition.

Figure 1:
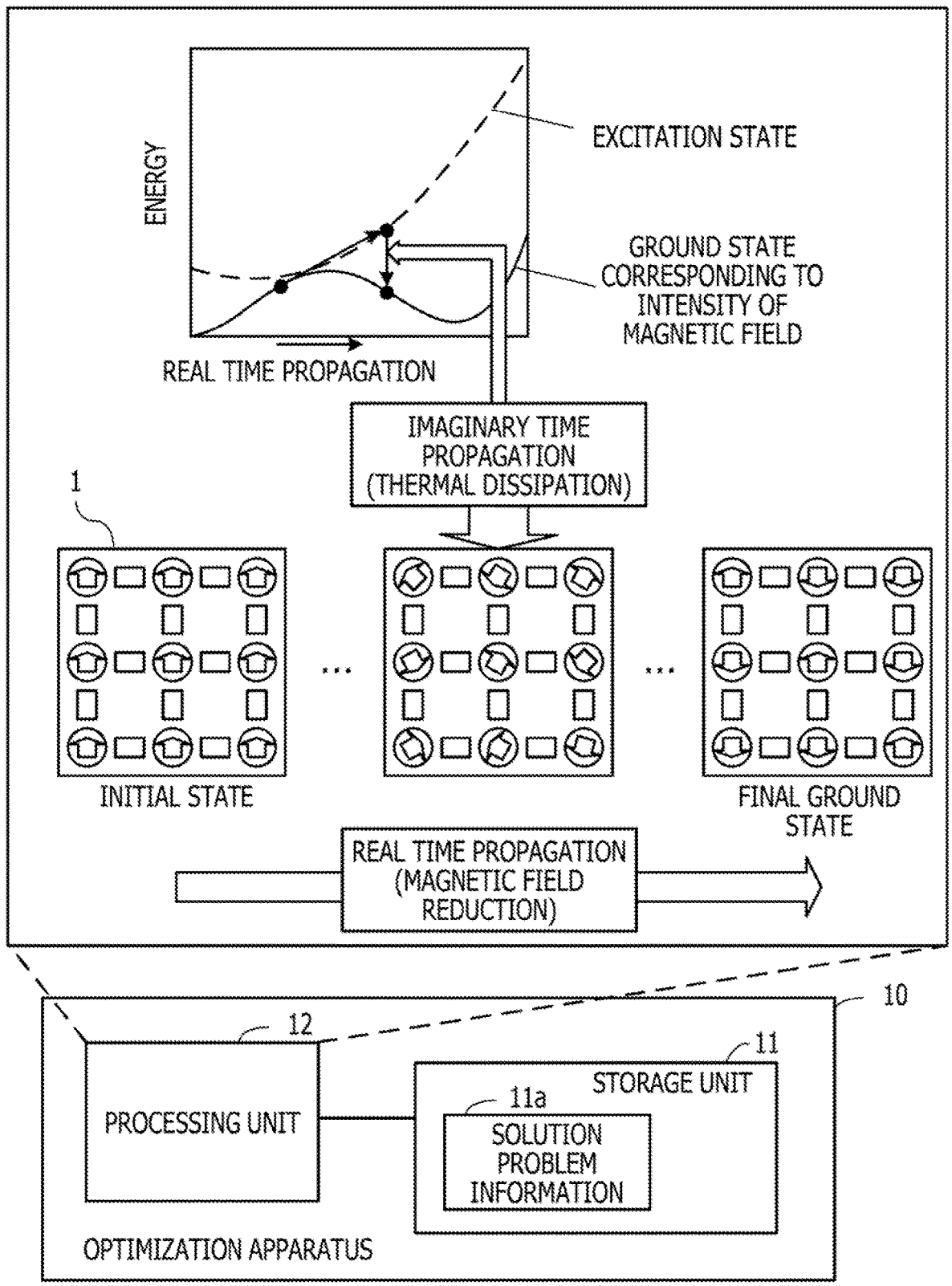
FIG. 1 illustrates an example of an optimization method according to a first embodiment.

FIG. 1 illustrates an example of an optimization method according to the first embodiment. FIG. 1 illustrates an optimization apparatus 10 that performs an energy optimization method for an Ising model 1. The optimization apparatus 10 may perform the optimization method, for example, by executing an optimization program.

The optimization apparatus 10 includes a storage unit 11 and a processing unit 12. The storage unit 11 is, for example, a memory included in the optimization apparatus 10, or a storage device. The processing unit 12 is, for example, a processor included in the optimization apparatus 10, or an arithmetic circuit.

The storage unit 11 stores solution problem information 11a indicating a problem to be solved. The problem to be solved is, for example, a minimum value solution problem. The problem to be solved is, for example, a problem convertible into the Ising model 1. For example, information regarding the Ising model 1 indicating the problem to be solved is set in the solution problem information 11a. The Ising model 1 is defined by binary N variables (the number of binary variables is N), and a final ground state of the Ising model 1 represents an optimum solution to the problem to be solved.

The processing unit 12 solves the ground state of the Ising model 1 by using the variational principle based on quantum mechanics. In other words, the processing unit 12 simulates a state change of the Ising model 1 when a magnetic field applied to the Ising model 1 indicating the problem to be solved is reduced. When the ground state of the Ising model 1 is solved, the processing unit 12 performs a real time propagation process (first process) of reducing an intensity of the magnetic field applied to the Ising model 1 as time progresses in the simulation. Through the real time propagation process, the magnetic field applied to the Ising model 1 is gradually reduced, and, when the magnetic field becomes "0", the Ising model 1 enters the ground state. The processing unit 12 executes a thermal dissipation process (second process) of reducing energy of the Ising model 1 based on an imaginary time propagation method during the real time propagation process. In other words, the processing unit 12 generates the time that progresses in the simulation as imaginary time, advances the imaginary time, and thus obtains a ground state of the Ising model 1 corresponding to a magnetic field applied at the time point. The ground state of the Ising model 1 corresponding to the magnetic field is a ground state (steady ground state) of the Ising model in a steady state in which a real time at the time point is regarded as a fixed parameter. The ground state of the Ising model 1 when the real time propagation process progresses and the intensity of the magnetic field becomes "0" is the ground state as a solution result.

The real time propagation and the imaginary time propagation are combined with each other in the above-described way, and thus it is possible to efficiently solve the ground state of the Ising model 1. The reason for this will be described below.

As described above, one of the causes for the increased time for the solution retrieval using the QA method is the occurrence of a phenomenon called first-order quantum phase transition. In other words, when the occurrence of the first-order quantum phase transition is suppressed, the solution retrieval time is increased. Therefore, the reason why the solution retrieval time in the minimum value solution problem is increased when the occurrence of the first-order quantum phase transition is suppressed will be described in detail.

In addition, the ground state of the Ising model 1 is a state in which the energy of the Hamiltonian that represents the Ising model 1 is lowest. Hereinafter, the ground state of the Ising model 1 may also be referred to as a ground state of the Hamiltonian. Furthermore, a magnetic field applied to the Ising model 1 in the QA method is referred to as a transverse magnetic field.

In a case of performing solution according to the QA method, a term to which a transverse magnetic field is added is prepared as an initial state. In a case where the thermal dissipation process is not performed, the intensity of the transverse magnetic field of the Hamiltonian of an optimization problem defined as a binary N-variable problem desired to be obtained is weakened sufficiently slowly from now on such that the transverse magnetic field finally becomes 0. In this case, a wave function of the system is caused to sufficiently slowly transition from an initial state to a wave function in the ground state of the Ising model to be solved, and a magnetic field is weakened such that excitation to an excitation state does not occur. This is referred to as adiabatic transition. As a result of the adiabatic transition, the system finally transitions to the ground state of the Hamiltonian to be solved. In the above-described way, the ground state of the quantum Ising Hamiltonian to be solved may be obtained.

On the other hand, in the QA method, an energy gap between the ground state and the excitation state is reduced depending on the Hamiltonian of the system, and thus there is a problem that the time required for the adiabatic transition is increased such that the Hamiltonian does not transition to an excitation state. In other words, the transition to the excitation state occurs due to a decrease in an energy difference between the ground state and the first excitation state in the intermediate Hamiltonian during the adiabatic transition. In a case where the QA method is used, in order to suppress the transition to the excitation state, when the energy difference between the ground state and the first excitation state is small, the optimization apparatus 10 reduces an amount of weakening the transverse magnetic field such that the transition to the excitation state does not occur, and thus causes the Hamiltonian to transition slowly.

Here, a case where the energy difference exponentially decreases as a function of the number of spins is referred to as first-order quantum phase transition. In a case where quantum phase transition is in a first order, a time step width for time propagation while observing the adiabatic transition condition following the QA method depends on an energy gap between the ground state and the excitation state. Thus, the optimization apparatus exponentially reduces the time step width. This indicates that the number of times of time propagation for reaching a final state according to the QA method exponentially increases.

On the other hand, there is also a case where the energy difference decreases by a power as a function of the number of spins. This is called second-order quantum phase transition. When the second-order quantum phase transition occurs, a speed of the adiabatic transition in the QA method decreases by a power. In this case, the time required to reach a final state increases with a polynomial time.

However, since many of problems that are of interest in applications involve the first-order quantum phase transition, a computation time exponentially increases in many practical problems. Therefore, studies have been performed to find out whether or not it is possible to replace the first-order quantum phase transition with the second-order quantum phase transition. In a system of a special Hamiltonian called a non-stoquastic Hamiltonian, there is also a report that first-order phase transition may be changed to second-order phase transition by devising a transverse magnetic field term (NPL 6). Therefore, in the framework of the ordinary QA method, a method of avoiding the first-order quantum phase transition is a central problem in executing computation.

On the other hand, as another field, there is a document analyzed from the viewpoint of the atomic molecular physics field (NPL 11). In a method disclosed in the document, the Schrödinger equation is directly solved, but analysis is performed under a condition that excitation to an excitation state does not occur. The same applies to an atomic theory approach, and a strong restriction is imposed on weakening of a magnetic field in order to execute computation under a condition that excitation to an excitation state does not occur.

As described above, in the QA method, it has been desired to observe the adiabatic transition condition. However, it has been reported that, in computation using a quantum computer based on the QA method, there is a possibility that the ground state may be computed with a finite probability even though the adiabatic condition is breached (NPL 7).

In light of these circumstances, it is considered that energy dissipation may occur. Therefore, in order to fundamentally understand a QA process, it is important to handle the QA process as a process in which thermal dissipation may occur in the framework of the atomic theory.

The thermal dissipation is based on interaction with an external environment. Thus, it is desired to incorporate the influence of the external environment into the Hamiltonian as a thermal dissipation term. A method of handling the energy dissipation has been developed in the field of atomic physics. According to the method, the time-dependent Schrödinger equation is solved in imaginary time.

As a specific example of a method of handling energy dissipation, there is a method considered for handling a Bose-Einstein condensate of a dilute atomic gas. It is noted that the Bose-Einstein condensate may be referred to as a Bose condensate. Although the theory of Bose-Einstein condensation of a dilute atomic gas has been studied in many aspects, computation of quantum vortices is troublesome in theoretical handling. In addition, it has been found that, when the Bose-Einstein condensate is experimentally stirred with an optical spoon, a quantized vortex is experimentally observed (NPL 8). It has been found that a ground state of quantized vortex in Bose-Einstein condensate is favorably approximated by an equation in which an angular momentum term is added to the Gross-Pitaevskii (GP) equation obtained as a result of mean field approximation.

However, it is very difficult to obtain a ground state of the GP equation for a vortex lattice. This is because neither the symmetry of the vortex lattice nor the number of vortices is known from the equation. As described above, there is a situation in which information such as symmetry is not known despite the existence of the ground state. A method used to compute the ground state of the vortex lattice at this time is an imaginary time propagation method. It is possible to compute the ground state by using the imaginary time propagation method even in a case where there is no information such as symmetry with respect to the ground state of the system (NPL 9).

In the imaginary time propagation method, time is set to an imaginary number, and thus a quantum mechanical time propagation operator (may be referred to as "time propagator") changes from an $\exp(-iEt)$ type to an $\exp(-E\tau)$ type (where i is the imaginary unit, E is energy, t is a real time, and $\tau$ is an imaginary time). According to the time propagator (may be referred to as "time propagation operator") using the imaginary time, as the energy becomes larger, the attenuation occurs at a higher speed, and the energy decreases. This is a method often used in quantum theory of energy dissipation.

When it is considered that a time propagator of imaginary time corresponds to Boltzmann distribution $\exp(-E/(k_B T))$ in statistical mechanics, a physical concept of the imaginary time propagation method may be intuitively understood (where $k_B$ is a Boltzmann constant, and T is a temperature). When the time propagator of the imaginary time is compared with the Boltzmann distribution, it is found that there is a correspondence relationship of $T \propto 1/\tau$ between the imaginary time $\tau$ and the temperature T. In other words, the time propagation of $\tau \to \infty$ in the imaginary time propagation is the same as $T \to 0$ in the Boltzmann distribution. Then, it may be analyzed that the time propagation of $\tau \to \infty$ in the imaginary time propagation is to perform quantum thermal annealing.

As described above, thermal dissipation process may be performed based on the imaginary time propagation method, and the Hamiltonian in an excitation state may be caused to transition to a ground state due to thermal dissipation. Then, temporary transition to an excitation state may be permitted in solving a ground state, and thus the adiabatic transition condition may not be observed.

Therefore, the processing unit 12 allows the adiabatic transition condition not to be satisfied, and determines a time step width in the real time propagation. In other words, the processing unit 12 performs the QA method based on the real time propagation by using non-adiabatic transition. In a case of the non-adiabatic transition, even when an energy gap between the ground state and the excitation state is small depending on the Hamiltonian, it is not desired to reduce a real time step width. Accordingly, efficient transition to the final ground state of the Ising model 1 is performed.

Furthermore, for example, whenever the real time in the real time propagation progresses, the processing unit 12 causes a state of the Ising model 1 to transition to a ground state corresponding to the transverse magnetic field applied at that time point according to the imaginary time propagation method. Thus, heat dissipation can always occur while weakening external magnetic field. As a result, even when the Ising model 1 is in an excitation state due to the progress of the real time, the Ising model 1 immediately transitions to a ground state corresponding to a transverse magnetic field at that time point. Since the thermal dissipation process is performed whenever the real time progresses, the Ising model 1 may stably transition to a ground state and thus efficiently transition to a final ground state.

Furthermore, the processing unit 12 performs renormalization of a wave function representing the energy of the Ising model whenever thermal dissipation is performed, By incorporating the thermal dissipation effect, the probability is not preserved. A value becomes 1 as a result of performing the normalized integral of the wave function, but decreases from 1 whenever imaginary time propagation is continued. In order to avoid this, the processing unit 12 renormalizes the wave function and thus forces a wave function normalization condition to be 1. In the above-described way, it is possible to avoid the problem that the wave function becomes 0 as the imaginary time propagation progresses by continuing computation such that the normalization condition is observed while incorporating the thermal dissipation effect.

Further, the processing unit 12 may determine a step width of an imaginary time that progresses according to the imaginary time propagation method, based on a value of a variable by which the step width of the imaginary time is multiplied in computation in the imaginary time propagation method. For example, the processing unit 12 introduces a coefficient $\zeta$ for controlling the step width of the imaginary time. Then, the processing unit 12 simulates a quantum system while changing the coefficient $\zeta$ so as to cause energy dissipation with appropriate intensity.

For example, the processing unit 12 reduces a value of the coefficient $\zeta$ as a value of a variable by which a step width of the imaginary time is multiplied (the variable being computed whenever the imaginary time progresses) becomes greater. Furthermore, for example, the processing unit 12 increases the value of the coefficient $\zeta$ as the value of the variable by which the step width of the imaginary time is multiplied becomes smaller. In addition, in a case where there are a plurality of variables by which the step width of the imaginary time is multiplied in the computation in the imaginary time propagation method, the processing unit 12 determines the value of the coefficient $\zeta$ based on, for example, a variable having an averagely great value.

Second Embodiment

In a second embodiment, a Neumann type computer is used to perform computation based on the principle of quantum mechanics on a minimum value solution problem defined by binary N variables, and thus a ground state (optimum value) of the system and a wave function (combinations of state variables at the optimum value) in the ground state are obtained.

<Hardware Configuration of Optimization Apparatus>

Figure 2:
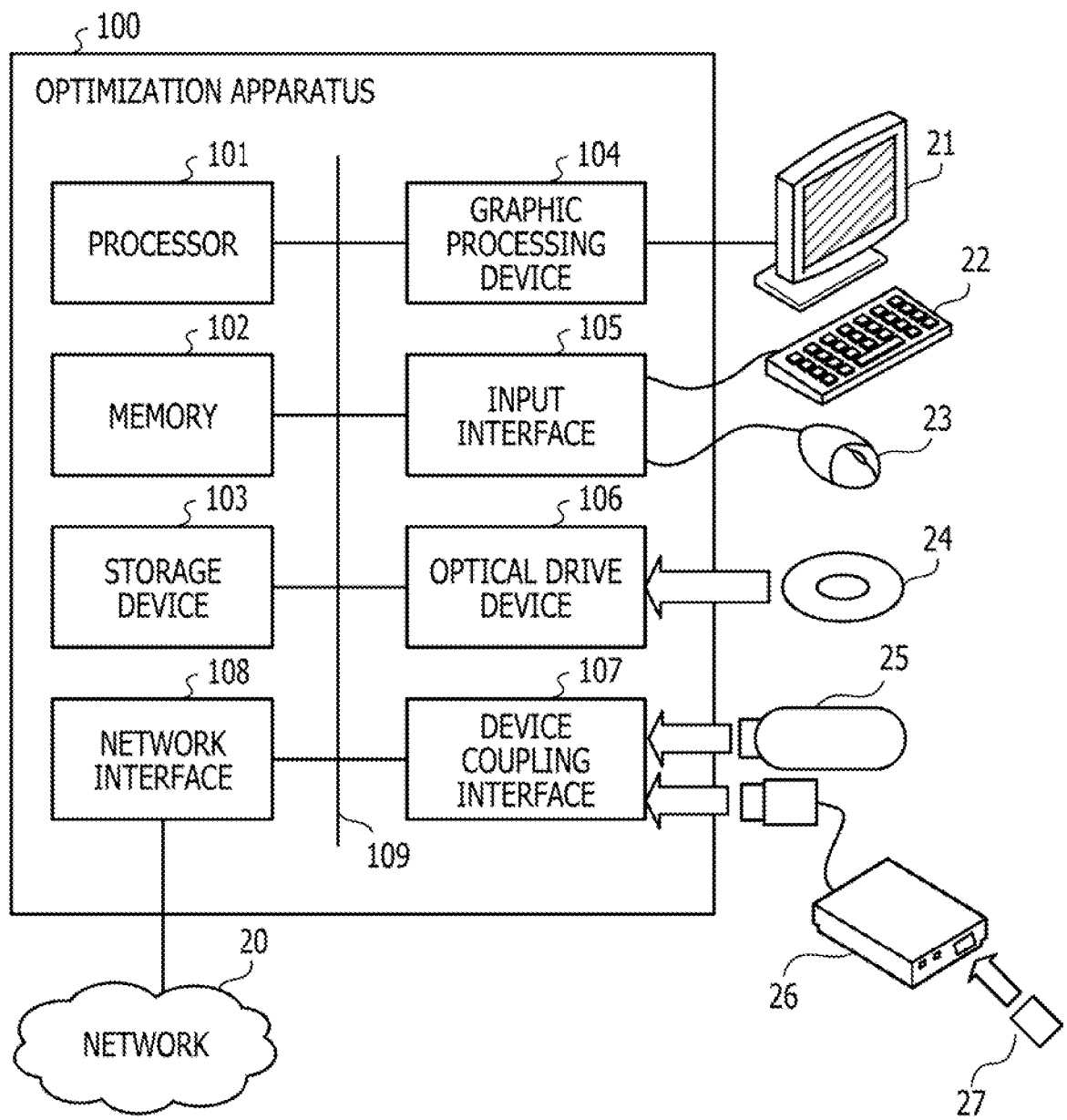
FIG. 2 illustrates an example of hardware of an optimization apparatus.

FIG. 2 illustrates an example of hardware of an optimization apparatus. An optimization apparatus 100 is entirely controlled by a processor 101. The processor 101 is coupled to a memory 102 and a plurality of peripheral devices via a bus 109. The processor 101 may be a multiprocessor. The processor 101 is, for example, a central processing unit (CPU), a microprocessor unit (MPU), or a digital signal processor (DSP). The processor 101 realizes functions by executing a program. Some of the functions may be realized by an electronic circuit such as an application-specific integrated circuit (ASIC) or a programmable logic device (PLD).

The memory 102 is used as a main storage device of the optimization apparatus 100. The memory 102 temporarily stores at least some programs of an operating system (OS) to be executed by the processor 101 and application programs. Furthermore, the memory 102 stores various pieces of data used for processes executed by the processor 101. As the memory 102, a volatile semiconductor storage device such as a random-access memory (RAM) is used.

The peripheral devices coupled to the bus 109 include a storage device 103, a graphic processing device 104, an input interface 105, an optical drive device 106, a device coupling interface 107, and a network interface 108.

The storage device 103 electrically or magnetically writes and reads data to and from a recording medium included in the storage device 103. The storage device 103 is used as an auxiliary storage device of a computer. The storage device 103 stores the programs of the OS, the application programs, and various pieces of data. In addition, as the storage device 103, for example, a hard disk drive (HDD) or a solid-state drive (SSD) may be used.

The graphic processing device 104 is coupled to a monitor 21. The graphic processing device 104 displays an image on a screen of the monitor 21 in response to an instruction from the processor 101. The monitor 21 may be a display device using organic electro luminescence (EL), a liquid crystal display device, or the like.

The input interface 105 is coupled to a keyboard 22 and a mouse 23. The input interface 105 transmits, to the processor 101, signals transmitted from the keyboard 22 and the mouse 23. In addition, the mouse 23 is an example of a pointing device. Another pointing device may be used. Another pointing device is a touch panel, a tablet, a touch pad, a trackball, or the like.

The optical drive device 106 reads data recorded on an optical disc 24 or writes data to the optical disc 24 by using laser light or the like. The optical disc 24 is a portable recording medium storing data that is readable through light reflection. The optical disc 24 is a digital versatile disc (DVD), a DVD-RAM, a compact disc read only memory (CD-ROM), a CD-recordable (CD-R), a CD-rewritable (CD-RW), or the like.

The device coupling interface 107 is a communication interface that couples the peripheral devices to the optimization apparatus 100. For example, the device coupling interface 107 may be coupled to a memory device 25 and a memory reader/writer 26. The memory device 25 is a recording medium having a communication function of communicating with the device coupling interface 107. The memory reader/writer 26 is a device that writes data to a memory card 27 or reads data from the memory card 27. The memory card 27 is a card type recording medium.

The network interface 108 is coupled to a network 20. The network interface 108 transmits and receives data to and from another computer or a communication device via the network 20.

With the above-described hardware configuration, the optimization apparatus 100 may realize processing functions in the second embodiment. In addition, the optimization apparatus 10 described in the first embodiment may also be implemented by the same hardware as that of the optimization apparatus 100 illustrated in FIG. 2.

The optimization apparatus 100 realizes the processing functions in the second embodiment by, for example, executing the program recorded on a computer-readable recording medium. The program in which details of processes to be executed by the optimization apparatus 100 are described may be recorded on various recording media. For example, the program to be executed by the optimization apparatus 100 may be stored in the storage device 103. The processor 101 loads at least a part of the program in the storage device 103 into the memory 102 and executes the program. Furthermore, the program to be executed by the optimization apparatus 100 may be recorded on a portable recording medium such as the optical disc 24, the memory device 25, or the memory card 27. For example, the program stored on the portable recording medium may be installed in the storage device 103 and executed under the control of the processor 101. Furthermore, the processor 101 may read the program directly from the portable recording medium and execute the program.

The optimization apparatus 100 having such hardware may be used to obtain a ground state of the system and a wave function in the ground state by performing computation based on the principle of quantum mechanics with respect to the minimum value solution problem defined by the binary N variables.

<Overview of Method of Calculating Ground State>

Next, an overview of a method of calculating a ground state will be described. In addition, in the following description, "i" may be used as a number for distinguishing elements such as spins and may be used as the imaginary unit. In a case where "i" is the imaginary unit, the fact is added to a corresponding portion.

The optimization apparatus 100 uses, for example, the Hamiltonian in the QA method to obtain a ground state energy of the system and a wave function in the ground state. In the QA method, a transverse magnetic field is applied to N spins as an initial state. Therefore, the optimization apparatus 100 prepares a quantum state that may be experimentally prepared as an initial state. The optimization apparatus 100 weakens the transverse magnetic field from the state with the passage of time. Then, finally, the transverse magnetic field completely disappears, and a ground state of the Hamiltonian to be solved, that is, an energy minimum value is obtained. In a numerical solution method for the minimum value retrieval problem, a quantum Monte Carlo method may be used. However, since a phenomenon called first-order quantum phase transition occurs in this method, a strong restriction is imposed on weakening of a transverse magnetic field.

Therefore, the optimization apparatus 100 obtains the ground state energy of the system and the wave function in the ground state by using a process generally having the following two features, so as to relieve the restriction on weakening of the transverse magnetic field.

The first feature is to use two time parameters in order to avoid the quantum phase transition. In the QA method, the transverse magnetic field is weakened in accordance with the real time $t_1$. The optimization apparatus 100 prepares separate imaginary time $t_2$ in addition to the real time $t_1$ for which the transverse magnetic field is weakened. The time $t_2$ is used for thermal dissipation of energy in terms of quantum theory, that is, for quantum temperature annealing. The energy may be forced to be reduced by performing quantum temperature annealing. In other words, when the transverse magnetic field is weakened, an excitation state may occur depending on a weakening method. Therefore, the optimization apparatus 100 attenuates the energy in the second time. Moreover, two time axes are alternately advanced such that the first time is advanced and thus the magnetic field is weakened. Thus, a QA process of weakening the transverse magnetic field while performing cooling is realized.

As an initial state of the Ising model, the optimization apparatus 100 selects, for example, an apparent initial state of a transverse magnetic field system, for example, a state in which an initial state may be created in an actual experiment. The wave function in the ground state may be reached by performing the QA process along the two time axes from the initial state.

The second feature is that the second time is set to a complex number in order to realize quantum thermal annealing. This method is called an imaginary time propagation method, and it is possible to realize a method that may be analyzed as thermal annealing by performing imaginary time propagation. This method is a method used for incorporating a quantum energy dissipation mechanism. The optimization apparatus 100 directly evaluates a time propagator by using the imaginary time propagation method, and may thus simulate a situation in which N spins are inverted while changing over time and converge to a ground state.

Furthermore, the time is set to be a complex number such that the real part of the time represents actual time and the imaginary part represents energy dissipation. The way of energy dissipation may be increased or decreased by multiplying the imaginary part by a coefficient. The optimization apparatus 100 may simulate a situation in which quantum computation progresses while causing thermal dissipation by using such a mechanism.

The optimization apparatus 100 advances the real time $t_1$ along the first time axis on which a magnetic field is weakened, fixes $t_1$, and performs imaginary time propagation on the second time $t_2$. In this case, computation is performed until convergence to the ground state at the intensity of the magnetic field occurs. Moreover, the optimization apparatus 100 continues the computation until the intensity of the transverse magnetic field becomes "0". After the energy converges, the optimization apparatus 100 analyzes a spin state (bit state) corresponding to a classical Hamiltonian defined as a binary problem and energy thereof, and outputs the spin state and the energy as a final result.

A principle of realizing the energy dissipating mechanism based on the imaginary time may be simply described as follows. The time propagation in the time-dependent Schrödinger equation may be described by a time propagator $\exp(-iEt)$ (where i is the imaginary unit). When time is set to a complex number, a term that exponentially attenuates as in $\exp(-E\tau)$ appears. $\exp(-iEt)$ (where i is the imaginary unit) represents vibration, and an absolute value thereof is 1 at all times. However, when time is set to an imaginary number, this becomes an attenuation function, and the absolute value attenuates from 1. From this principle, energy attenuation may be simulated.

At the start time of the simulation, a wave function in an initial state is a wave function in which states of various pieces of energy $E_0, E_1, E_2, \ldots, E_n, \ldots$ are mixed with each other (where n is an integer of 0 or greater). This may be interpreted as a kind of high temperature limit. However, when time propagation is performed in imaginary time, a term of the energy $E_n$ follows the time propagator, and an amplitude of a component of the wave function attenuates according to $\exp(-E_n\tau)$. Therefore, all states other than $E_0$ which is energy to be obtained attenuate according to $\exp(-(E_n-E_0)\tau)$ with respect to the amplitude of $E_0$. Thus, a high energy component disappears as the time propagation is performed in the imaginary time, and, finally, only the amplitude of the most stable energy $E_0$ state is obtained.

In addition, when the time is set to a complex number, the normalization condition for the wave function is not conserved, and the amplitude of the most stable energy $E_0$ state also disappears in this state. The normalization of the wave function indicates that an integral value of the square of an absolute value of the wave function in the entire space becomes "1". In other words, when the time is set to a complex number, the integral value of the square of the absolute value of the wave function in the entire space becomes less than "1". Thus, the optimization apparatus 100 performs renormalization whenever the time propagation is performed, and performs simulation such that the normalization condition for the wave function is conserved. Then, an amplitude in an excitation state of the system becomes small enough to be ignored with respect to an amplitude in a ground state according to imaginary time propagation, and finally reaches the ground state of the system. Moreover, this state is the ground state in the energy optimization problem to be obtained.

Hereinafter, a method of obtaining the ground state in the energy optimization problem by using time of a complex number will be referred to as a quantum thermal simulated annealing method, and will be abbreviated to a QTSA method.

Furthermore, although the QTSA method uses imaginary time, $T \propto 1/\tau$ is obtained by using a correspondence relationship between the time propagation operator $\exp(-E\tau)$ in imaginary time in quantum mechanics and the Boltzmann distribution $\exp(-E/(k_B T))$ in statistical mechanics. From this, the time propagation of the imaginary time T may be analyzed as an operation of lowering a temperature. In this sense, it may be said that the optimization apparatus 100 solves a problem by performing simulated annealing extended in quantum theory.

A computation principle of the QTSA method is theoretically based on a variational principle. The variational principle is a versatile method used to obtain a quantum mechanical ground state (lowest energy state), and is a powerful method. From this, in the QTSA method, it is guaranteed that the energy decreases as the wave function approaches the ground state.

Next, a difference between the QTSA method and the quantum Monte Carlo (QMC) method will be described. The basic idea of the QMC method is that computation of a distribution function is represented by a distribution function of a corresponding classical Ising model, and the distribution function of the classical system is examined according to a method based on probability theory such as a Markov chain Monte Carlo method. In contrast, in the QTSA method, for example, starting from an obvious initial state (all spins are upward, all spins are downward, upward spins and downward spins are half, and the like), time propagation of a quantum system is directly computed without change according to a deterministic method. Therefore, it is possible to directly compute states of all spins in time propagation according to the deterministic method.

<Ising Model and Hamiltonian of Problem>

Next, an Ising type minimum value solution problem (Ising type problem) to be solved by the optimization apparatus 100 will be described. The Ising type problem is a model originally used for research of a magnetic substance in a physical region, and total energy when there are N spins is described by the following equation (1-1).

$$H(\{x\}) = \sum_{j>i}^{N} W_{ij} x_i x_j + \sum_{i=1}^{N} b_i x_i + C \tag{1-1}$$

The first term on the right side is integration of products of values (0 or 1) of two state variables and weight coefficients of all the combinations of N state variables, the integration being performed without omission and overlapping. $x_i$ represents an i-th state variable, $x_j$ represents a j-th state variable, and $W_{ij}$ is a weight coefficient representing a magnitude of the interaction between $x_i$ and $x_j$. The second term on the right side is a summation of products of bias coefficients ($b_i$) of the respective state variables and the values of the corresponding state variables, and the third term (C) on the right side is a constant.

The minimum value solution problem is a problem of obtaining the minimum value of the Hamiltonian given by Equation (1-1). In addition, it is known that, when the minimum value of the Hamiltonian represented by Equation (1-1) is obtained according to computation based on the Monte Carlo method or the like, an amount of computation for obtaining the minimum value is generally about $2^N$ times. In other words, the computation time for obtaining an optimum solution is not suppressed by the polynomial time, but increases exponentially.

To solve this problem, quantum theory is started. The Hamiltonian represented by Equation (1-1) is transformed into following quantized Hamiltonian (1-2), (1-3), and (1-4), $$\hat{H}_{TH} = \hat{H}_Q + \hat{H}_{TL} + C \tag{1-2}$$

$$\hat{H}_Q = \sum_{j>i}^{N} W_{ij}\hat{\sigma}_i^z\hat{\sigma}_j^z \tag{1-3}$$

$$\hat{H}_{TL} = \sum_{i=1}^{N} b_i\hat{\sigma}_i^z \tag{1-4}$$

Equation (1-2) is obtained by quantizing Equation (1-1), The Hamiltonian $H_{TH}$ (the subscript TH stands for target Hamiltonian) is on the left side of Equation (1-2). In Equations (1-3) and (1-4), $\sigma_i^z$ is a z component of a Pauli matrix of an i-th spin. The Pauli matrix is a set of a z component, an x component, and a y component. Each of the z component, the x component, and the y component of the Pauli matrix is represented by the following Equation (1-5).

$$\hat{\sigma}_i^z = \begin{pmatrix} 1 & 0 \\ 0 & 0 \end{pmatrix} \quad \hat{\sigma}_i^x = \begin{pmatrix} 0 & 1 \\ 1 & 0 \end{pmatrix} \quad \hat{\sigma}_i^y = \begin{pmatrix} 0 & -i \\ i & 0 \end{pmatrix} \tag{1-5}$$

In addition, since a spin state is correlated with |1> and |0>1 instead of |1> and |−1>, a value in the second row and the second column of $\sigma_i^z$ is "0". The spin state |1> is represented by a column vector of (1,0), and the spin state |0> is represented by a column vector of (0,1). In addition, spin inversion may not be described when the dynamics of the quantum mechanics are described only with Equation (1-2), Equation (1-3), and Equation (1-4). Therefore, the Hamiltonian of Equation (1-6) to which a transverse magnetic field term is added is defined as a quantum mechanical Hamiltonian.

$$\hat{H}(\lambda) = G_1\hat{H}_{TH} + G_2\hat{H}_0 \tag{1-6}$$

$H_0$ (with ^) in Equation (1-6), which is referred to as a transverse magnetic field term, is a term introduced to describe spin inversion when transformed into a time-dependent quantum mechanical equation, and is defined by the following Equation (1-7).

$$\hat{H}_0 = \sum_{i=1}^{N} J_i\hat{\sigma}_i^x \tag{1-7}$$

$J_i$ is a coefficient indicating a magnetic field acting on an i-th spin. Here, $G_2$ in Equation (1-6) is a constant that defines the intensity of the transverse magnetic field term. Equation (1-6) is related to a QA method derived according to NPL 5. $G_1$ is a constant determined in accordance with $G_2$. In the QA method disclosed in NPL 5, $G_1$ is $\lambda$ and $G_2$ is $1-\lambda$. $\lambda$ is a parameter indicating the intensity of the transverse magnetic field. A ground state of the Hamiltonian in the ground state is given by $N_{TH}$ (with ^).

<Relationship Between QA Method and QTSA Method>

When the time-dependent Schrödinger equation defined by the Hamiltonian in Equation (1-6) is solved, it is finally desired that the transverse magnetic field term disappears. In the QA method, $\lambda$ is changed as a function of time, and is temporally changed such that $\lambda(0)=0$ and $\lambda(t_{max})=1$ (where $t_{max}$ is the maximum value of real time subjected to time propagation).

In the QA method, the adiabatic transition condition is observed by changing $\lambda$ sufficiently slowly. As a result, the system in the ground state of the transverse magnetic field term at $\lambda(0)=0$ transitions to the Hamiltonian to be solved without being excited to an excitation state.

A condition for a speed of changing $\lambda$ for observing the adiabatic transition is given by an energy difference between a ground state of the Hamiltonian in an intermediate state and a first excitation energy state. In a case where the first-order quantum phase transition occurs, the excitation energy exponentially decreases with respect to the number of spins. Thus, as a condition for observing the adiabatic transition condition, it is desired to exponentially delay a temporal change of $\lambda$. Thus, a substantial computation speed is exponentially delayed.

In the QTSA method, the following strategy is employed to relieve a condition for observing the adiabatic transition condition. The basic idea is not to cause adiabatic transition such that excitation to an excitation state does not occur through first-order quantum phase transition, but to consider that deexcitation efficiently occurs even when the excitation occurs. The deexcitation may be realized by using the imaginary time propagation method.

Figure 3:
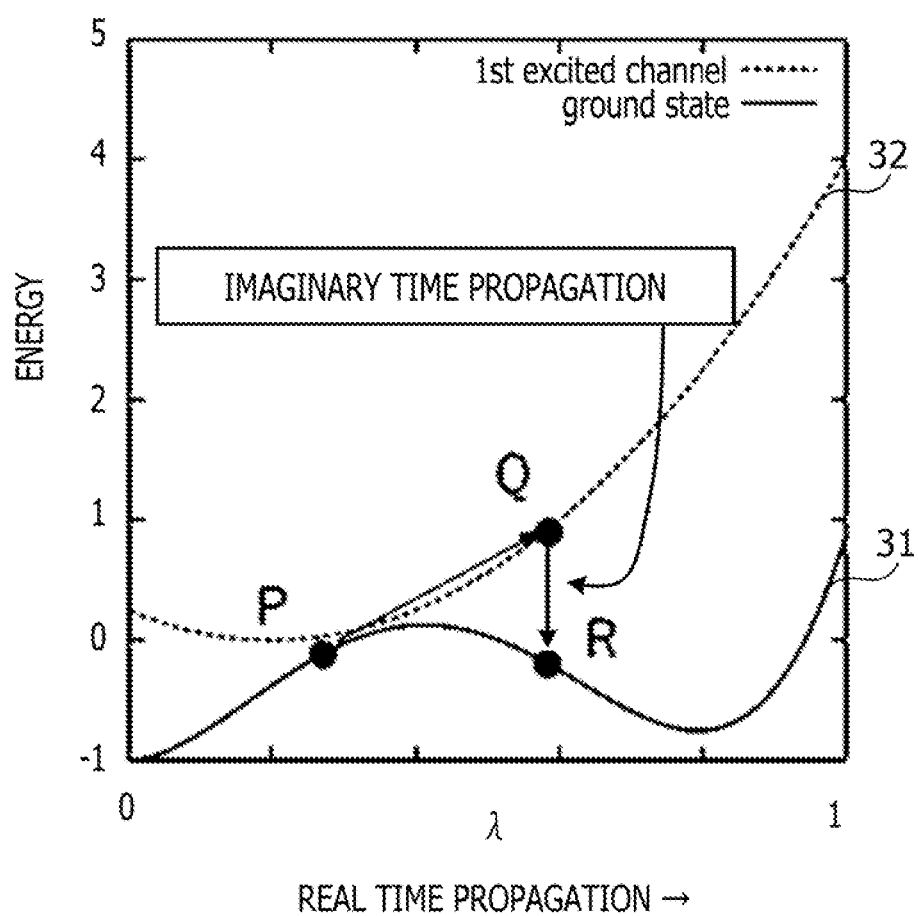
FIG. 3 is a schematic diagram illustrating thermal dissipation using an imaginary time propagation method.

FIG. 3 is a schematic diagram illustrating thermal dissipation using the imaginary time propagation method. FIG. 3 is a graph in which a transverse axis expresses $\lambda$ and a longitudinal axis expresses energy of the system obtained by the Hamiltonian. In the example illustrated in FIG. 3, energy in a ground state corresponding to $\lambda$ when $\lambda$ transitions from 0 to 1 due to real time propagation is indicated by a solid line 31. Furthermore, the first excitation energy state corresponding to $\lambda$ is indicated by a dotted line 32.

In the ordinary QA method, when the magnetic field is greatly changed, a state in the ground state at a point P transitions to a point Q in the first excitation energy state. In the ordinary QA method, since such a situation is not allowed, the magnetic field is slowly weakened adiabatically. However, if energy may be deexdted from the point Q and dropped to a point. R, the adiabatic transition condition is not desired to be strictly observed.

The optimization apparatus 100 using the QTSA method uses two time parameters in order to realize a thermal dissipation mechanism for deexcitation. The first time parameter is the real time $t_1$ for changing $\lambda$ on the transverse axis in FIG. 3, The optimization apparatus 100 weakens the magnetic field by increasing $\lambda$ according to the real time $t_1$. In this case, since the excitation occurs when the magnetic field is weakened earlier, the optimization apparatus 100 introduces the imaginary time $t_2$ as the second time parameter in order to deexcite the excited one.

The optimization apparatus 100 uses, for example, a quantum annealing schedule to satisfy $\lambda(t_1=0)=0$ and also satisfy $\lambda(t_1=t)=1$ according to the real time. The optimization apparatus 100 sets an i-th time point in the middle to $t_i$, and sets corresponding $\lambda$ in the intermediate state to $\lambda_i$. The optimization apparatus 100 computes $H(\lambda_i)$ (with ^) defined by $\lambda_i$ to be sufficiently close to $H(\lambda_{i-1})$ (with ^) defined by $\lambda_{i-1}$ based on the following Equation (2-1).

$$\hat{H}(\lambda_i) = \hat{H}(\lambda_{i-1}) + dH \tag{2-1}$$

Two specific computation methods are conceivable. The first computation method is a method of performing computation until energy converges to a ground state of a Hamiltonian defined by given $\lambda_i$ according to the imaginary time propagation method, with respect to $\lambda_i$ given by real time $t_1=t_i$. In this method, after convergence to the ground state, the real time $t_1$ is increased in order to weaken the magnetic field. As described above, in a case where the first computation method is employed, the optimization apparatus 100 advances the computation while causing convergence to the ground state by alternately repeating time propagation of the real time and the imaginary time.

The second computation method is a method of simultaneously performing real time propagation and imaginary time propagation. When the real time propagation is performed, a magnetic field is weakened, but, at the same time, an imaginary time part causes thermal dissipation. In other words, the magnetic field is weakened while the thermal dissipation occurs. In this case, it is possible to perform computation while phenomenologically changing a dissipation intensity by adding a coefficient γ indicating an intensity of thermal dissipation in the imaginary time propagation. The second computation method indicates computation assuming a situation closer to an actual quantum computer.

Regardless of which computation method is used, if enough time for deexcitation is given, it may be considered that a ground state of $H_{TH}$ (with ^) to be solved is obtained when the transverse magnetic field finally completely becomes 0.

<Imaginary Time Propagation Method in Q ISA Method>

Next, an imaginary time propagation method in the QTSA method will be described. Furthermore, renormalization will also be described.

Generally, the Schrödinger equation is described as in the following Equation (3-1), $$\hat{H}|\Psi(t)\rangle = i\hbar \frac{\partial}{\partial t}|\Psi(t)\rangle \quad (3\text{-}1)$$

In Equation (3-1), i is the imaginary unit, H (with ^) is a Hamiltonian, and $|\psi(t)\rangle$ is a wave function representing a spin state at time t. h bar is a Dirac constant. Here, when an eigen equation is obtained in Equation (3-1), the following Equation (3-2) is obtained as a Schrödinger equation that does not depend on time.

$$\hat{H}|\psi_n\rangle = E_n|\psi_n\rangle \quad (3\text{-}2)$$

Here, $E_n$ is an n-th eigenvalue of the Hamiltonian H (with ^), and $|\psi_n\rangle$ is an n-th eigen state. Here, any wave function $|\psi(t)\rangle$ may be described by a linear combination of eigen states as in the following Equation (3-3) according to the expansion theorem in the Hilbert space, with a coefficient of $|\psi_n\rangle$ as $d_n(t)$.

$$|\Psi(t)\rangle = \sum_{n=0}^{\infty} d_n(t)\exp\left(-i\frac{E_n}{\hbar}t\right)|\psi_n\rangle \quad (3\text{-}3)$$

Here, time is set to an imaginary number in order to incorporate a phenomenological thermal dissipation term. For example, the time t is replaced with the following Equation (3-4).

$$t = -i\tau \quad (3\text{-}4)$$

i in Equation (3-4) is an imaginary operator. When Equation (3-4) is assigned to Equation (3-3), the following Equation (3-5) is obtained.

$$|\Psi(\tau)\rangle = \sum_{n=0}^{\infty} d_n(\tau)\exp\left(-\frac{E_n}{\hbar}\tau\right)|\psi_n\rangle \quad (3\text{-}5)$$

In other words, the time is set to an imaginary number, and thus a solution originally expressed by a vibration solution such as "exp(−ix)=cos(x)+i sin(x)" (where i is the imaginary unit) becomes a solution that exponentially attenuates such as "exp(−x)". In addition, Equation (3-6) is obtained by transforming Equation (3-5).

$$|\Psi(\tau)\rangle = \exp\left(-\frac{E_0}{\hbar}\tau\right)\sum_{n=0}^{\infty} d_n(\tau)\exp\left(-\frac{(E_n - E_0)}{\hbar}\tau\right)|\psi_n\rangle \quad (3\text{-}6)$$

The following Equation (3-7) is established for the coefficient part in Equation (3-6).

$$\lim_{\tau \to \infty}\exp\left(-\frac{(E_n - E_0)}{\hbar}\tau\right) = \delta_{n0} \quad (3\text{-}7)$$

Therefore, it is understood that, when Equation (3-7) is used for Equation (3-6) at the limit of τ>>1, Equation (3-6) gradually approaches Equation (3-8).

$$|\Psi(\tau)\rangle \cong d_0(\tau)\exp\left(-\frac{E_0}{\hbar}\tau\right)|\psi_0\rangle \quad (3\text{-}8)$$

Here, Equation (3-8) indicates that the vibration solution changes to an attenuation solution by setting time to an imaginary number. This is because a wave equation changes to a diffusion equation by setting time in the time-dependent Schrödinger equation to an imaginary number. However, Equation (3-8) also includes an attenuation term for the energy $E_0$ in the ground state. Therefore, when the time is set to infinity, $|\psi_n\rangle$ becomes "0" as expressed in Equation (3-9).

$$\lim_{\tau \to \infty}|\Psi(\tau)\rangle = 0 \quad (3\text{-}9)$$

In this state, all solutions disappear. This problem is caused by the fact that the unitarity is not maintained by setting time to an imaginary number. In other words, since the term of "|exp(−iEt)|=1" (where i is the imaginary unit) becomes an attenuation term when time is set to an imaginary number, the normalization condition for a wave function is not established. Therefore, the optimization apparatus 100 performs time propagation of a minute time (time step width Δτ) for the imaginary time, and then renormalizes an obtained wave function to "1". In other words, the optimization apparatus 100 executes a process of compensating for a lost probability.

When renormalization is performed, the attenuation term related to the ground state may be set to "1" at all times in Equation (3-8). This is because the norm of the ground state returns to "1" at the moment of renormalization. Thus, it is guaranteed that the following Equation (3-10) is established for a renormalized wave function $|\psi_{RN}(\tau)\rangle$.

$$\lim_{\tau \to \infty}|\Psi_{RN}(\tau)\rangle = |\psi_0\rangle \quad (3\text{-}10)$$

As described above, a ground state calculation method in the Schrödinger equation for time propagation by changing real time to imaginary time is the imaginary time propagation method. Next, a relationship between the imaginary time propagation method and the quantum thermal annealing will be described. In the imaginary time, a time propagator is an exponential function. Since this distribution has the same shape as the Boltzmann distribution, a correspondence relationship between those two equations are introduced. The Boltzmann distribution is expressed by the following Equation (3-11).

$$\exp\left(-\frac{E}{k_B T}\right) \tag{3-11}$$

When a correspondence relationship is taken assuming that the Boltzmann distribution is the same as the time propagator in the imaginary time, Equation (3-12) is obtained.

$$T - \frac{\hbar}{k_B T} \tag{3-12}$$

When physical analysis is performed based on the correspondence relationship, T→0 occurs at the limit of the imaginary time τ→∞. In other words, the imaginary time propagation in the QTSA method indicates that the effect of the phenomenological temperature is put into the quantum theory and annealing is performed.

A specific advantage of the QTSA method is that a phenomenon such as quantum phase transition, which is a problem in the QA method or the like, may be reduced. In the QA method, the Hamiltonian of the system changes while observing a condition that the unitarity is maintained and transition to an excitation state does not occur. This is equivalent to imposing a strong constraint on a method of transition from an initial state to a final state. Here, in a case where the QTSA method is not used, in order to suppress excitation of the Hamiltonian to an excitation state due to the first-order quantum phase transition in the process of the transition, a schedule of the adiabatic transition is exponentially delayed. Thus, there is a problem that computation time is exponentially increased.

On the other hand, in the QTSA method, this problem does not occur in principle. This is because adiabatic transition is not used. Even when the Hamiltonian is excited, the adiabatic transition condition may be relieved by rapidly deexciting the Hamiltonian. The framework of the theory of the imaginary time propagation used in the QTSA method is a general theory. In other words, the theory of imaginary time propagation uses only the mathematical fact that a wave function of the system may be expanded in a complete system and the fact that all states other than the ground state disappear in the imaginary time due to the imaginary time propagation. This discussion is established without depending on the Hamiltonian of the system.

Next, the time required for computation will be described. In order to obtain a solution in the ground state, it is desired that an amplitude of a wave function in all excitation states is sufficiently smaller than that in the ground state. The time for which the amplitude in the n-th excitation state attenuates is obtained from Equation (3-7), and the time for which the amplitude attenuates to $e^{-1}$ is given by Equation (3-13).

$$\Delta E_n = E_n - E_0 = \frac{\hbar}{\tau} \tag{3-13}$$

Therefore, a component that attenuates last defines the entire computation time. This state is a case where n=1, and is a first excitation state. Therefore, a guideline for the computation time is given by the following Equation (3-14).

$$\tau = \frac{\hbar}{\Delta E_1} \tag{3-14}$$

In addition, Equation (3-14) is an equation that defines a lower limit (upper limit value of computation speed) of computation time of quantum computation in the Ising type quantum computer. This is because, in Equation (3-14), in order to distinguish the first excitation state from the ground state in quantum computation, an observation time represented by the following Equation (3-15) is required.

$$\Delta \tau \cdot \Delta E_1 = \hbar \tag{3-15}$$

Since $\Delta E_1 = \hbar \Delta \omega$ (where h is h bar) in Equation (3-15), a relationship of the following Equation (3-16) is established between a computation time and an excitation frequency.

$$\Delta \tau \cdot \Delta \omega = 1 \tag{3-16}$$

Equation (3-16) is an equation called an uncertainty principle of time and frequency in Fourier transform. In quantum mechanics, the equation is called an uncertainty principle of time and energy. In other words, in order to distinguish a certain energy eigen state from another energy state closest to the certain energy eigen state, a minimum observation time given by the uncertainty principle is required.

In order to measure the ground state, it takes time to distinguish the ground state from the first excitation state. The time is determined by transition energy to the first excitation state. The optimization apparatus 100 may not compute the ground state in a time equal to or shorter than the time given by Equation (3-16) in principle. Therefore, Equation (3-16) is related to a lower limit value of a computation time in the optimization apparatus 100, for example, an upper limit value of a computation speed of the optimization apparatus 100. In addition, the minimum value of the computation time is determined based on an energy difference between the first excitation state and the ground state, and is determined according to Equation (1-1). Therefore, when a problem to be solved changes, the minimum time taken to solve the problem also changes.

<Definitions of Wave Function and Quantized Operator>

Next, in order to obtain an approximate equation of the time-dependent Schrödinger equation, matrix notations of a wave function and a spin operator are given, A wave function of the system in the real time t is described as $|\psi(t)\rangle$. Furthermore, a wave function of an i-th particle is described as $|\varphi_i(t)\rangle$. In this case, the ground of $|\varphi_i(t)\rangle$ may be described by a linear combination of an upward spin $|\alpha\rangle$ and a downward spin $|\beta\rangle$, and may thus be generally described according to the following Equation (4-1). In addition, the Greek character "φ" is expressed in a different character shape in the mathematical equation, but is used in the same meaning even when the character shape is different unless otherwise specified.

$$|\varphi_i(t)\rangle = C_{i\alpha}(t)|\alpha_i\rangle + C_{i\beta}(t)|\beta_i\rangle \tag{4-1}$$

Equation (4-1) is a ket vector notation. Therefore, when a bra notation is used, the following Equation (4-2) is obtained, $C_{i\alpha}(t)$ is a complex number representing a probability amplitude and a phase of a state of $|\alpha_i\rangle$ of the i-th spin. $C_{i\beta}(t)$ is a complex number representing a probability amplitude and a phase of a state of $|\beta_i\rangle$ of the i-th spin.

$$\langle\varphi_i(t)|=C_{i\alpha}{}^*(t)\langle\alpha_i|+C_{i\beta}{}^*(t)\langle\beta_i| \qquad (4\text{-}2)$$

Here, $C_{i\alpha}{}^*(t)$ and $C_{i\beta}{}^*(t)$ are respectively complex conjugates of $C_{i\alpha}(t)$ and $C_{i\beta}(t)$. Since a wave function is generally a function defined by a complex number in quantum mechanics, a coefficient is also defined as a complex number.

Next, calculation rules for spins will be described. Matrix notations of $\sigma_i^z$ (with ^), $\sigma_i^x$ (with ^), $|\alpha_i\rangle$, and $|\beta_i\rangle$ are respectively given by the following Equations (4-3), (4-4), (4-5), and (4-6).

$$\hat{\sigma}_i^z = \begin{pmatrix} 1 & 0 \\ 0 & 0 \end{pmatrix} \qquad (4\text{-}3)$$

$$\hat{\sigma}_i^x = \begin{pmatrix} 0 & 1 \\ 1 & 0 \end{pmatrix} \qquad (4\text{-}4)$$

$$|\alpha_i\rangle = \begin{pmatrix} 1 \\ 0 \end{pmatrix} \qquad (4\text{-}5)$$

$$|\beta_i\rangle = \begin{pmatrix} 0 \\ 1 \end{pmatrix} \qquad (4\text{-}6)$$

Although Equation (4-3) is different from a commonly used definition, this is because an eigenvalue of a spin operator is set to 1 and 0 instead of 1 and −1. Therefore, it may be easily confirmed that the following eigen equation is established for the longitudinal magnetic field term $\sigma_i^z$ (with ^).

$$\hat{\sigma}_i^z|\alpha_i\rangle = 1|\alpha_i\rangle \qquad (4\text{-}7)$$

$$\hat{\sigma}_i^z|\beta_i\rangle = 0|\beta_i\rangle \qquad (4\text{-}8)$$

The bra vectors $\langle\alpha_i|$ and $\langle\beta_i|$ are respectively defined as transposed matrices of corresponding ket vectors. The following Equations (4-9) and (4-10) are established for the transverse magnetic field term.

$$\hat{\sigma}_i^x|\alpha_i\rangle = |\beta_i\rangle \qquad (4\text{-}9)$$

$$\hat{\sigma}_i^x|\beta_i\rangle = |\alpha_i\rangle \qquad (4\text{-}10)$$

Furthermore, an orthogonal relationship given by the following Equation (4-11) is established for $|\alpha_i\rangle$ and $|\beta_i\rangle$.

$$\langle\alpha_i|\beta_i\rangle = \langle\beta_i|\alpha_i\rangle = \delta_{\alpha_i\beta_i} \qquad (4\text{-}11)$$

Here, since the normalization condition is established for a one-particle wave function, the following Equation (4-12) is established.

$$\langle\varphi_i(t)|\varphi_i(t)\rangle = |C_{i\alpha}|^2 + |C_{i\beta}|^2 = 1 \qquad (4\text{-}12)$$

Therefore, the following Equation (4-13) is a conditional equation for normalizing a spin state of one particle.

$$|C_{i\alpha}|^2 + |C_{i\beta}|^2 = 1 \qquad (4\text{-}13)$$

Next, equations used to evaluate expected values of respective operators are given below.

$$x_i = \langle\varphi_i(t)|\hat{\sigma}_i^z|\varphi_i(t)\rangle = |C_{i\alpha}|^2 \qquad (4\text{-}14)$$

$$y_i = \langle\varphi_i(t)|\hat{\sigma}_i^x|\varphi_i(t)\rangle = C_{i\alpha}{}^*(t)C_{i\beta}(t) + C_{i\beta}{}^*(t)C_{i\alpha}(t) \qquad (4\text{-}15)$$

$$\langle\alpha_i|\hat{\sigma}_i^z|\varphi_i(t)\rangle = C_{i\alpha}(t) \qquad (4\text{-}16)$$

$$\langle\beta_i|\hat{\sigma}_i^z|\varphi_i(t)\rangle = 0 \qquad (4\text{-}17)$$

$$\langle\alpha_i|\hat{\sigma}_i^x|\varphi_i(t)\rangle = C_{i\beta}(t) \qquad (4\text{-}18)$$

$$\langle\beta_i|\hat{\sigma}_i^x|\varphi_i(t)\rangle = C_{i\alpha}(t) \qquad (4\text{-}19)$$

Next, computation of an expected value of a wave function of an N-particle system will be described. A ground state of a wave function of an N-particle system may be described as the following Equation (4-20) by using the wave function of the one-particle system.

$$|\Psi(t)\rangle = \prod_{i=1}^{N} |\varphi_i(t)\rangle \qquad (4\text{-}20)$$

When a wave function of a (N−1)-particle system obtained by excluding only a wave function of an m-th particle (where m is an integer of or greater) as a wave function is expressed as $|\Psi_{\overline{m}}(t)\rangle$ (m is overlined), the following Equation (4-21) is obtained, $$|\Psi_{\overline{m}}(t)\rangle = \prod_{i=1, i \neq m}^{N} |\varphi_i(t)\rangle \qquad (4\text{-}21)$$

Since the normalization condition is also established for Equation (4-21), the following Equation (4-22) is established.

$$\langle\Psi_{\overline{m}}(t)|\Psi_{\overline{m}}(t)\rangle = 1 \qquad (4\text{-}22)$$

Furthermore, Equation (4-20) may also be expressed by the following Equation (4-23).

$$|\Psi(t)\rangle = |\Psi_{\overline{m}}(t)\rangle \otimes |\varphi_m(t)\rangle \qquad (4\text{-}23)$$

Here, a symbol in which a multiplication symbol is circled represents a direct product. An operation for extracting $C_{m\alpha}(t)$ and $C_{m\beta}(t)$ related to the m-th particle by using the standard orthogonal condition for the one-particle wave function may be defined according to the following Equations (4-24) and (4-25).

$$C_{m\alpha}(t) = \langle\alpha_m| \otimes \langle\Psi_{\overline{m}}(t)|\Psi(t)\rangle \qquad (4\text{-}24)$$

$$C_{m\beta}(t) = \langle\beta_m| \otimes \langle\Psi_{\overline{m}}(t)|\Psi(t)\rangle \qquad (4\text{-}25)$$

Further, a method of obtaining an expected value of energy will be described. Energy of the entire system defined by Equation (1-6) is indicated by $E(G_1, G_2)$. Energy of a transverse magnetic field defined by Equation (1-7) is $E_{0L}$. Further, energy of a second-order term of a longitudinal magnetic field term is $E_Q$, and energy of a first-order term is $E_{TL}$. When the energy is evaluated, Equations (4-28), (4-29), and (4-31) are obtained through computation described below.

$$E(G_1, G_2) = G_1 E_{TH} + G_2 E_{0L} \qquad (4\text{-}26)$$

$$E_{TH} = E_Q + E_{TL} + C \qquad (4\text{-}27)$$

$$E_Q = \langle\Psi|\hat{H}_Q|\Psi\rangle = \langle\psi|\sum_{j>i}^{N} W_{ij}\hat{\sigma}_i^z\hat{\sigma}_j^z|\Psi\rangle = \sum_{j>i}^{N} W_{ij}x_i x_j = \frac{1}{2}\sum_{i,j=1}^{N} W_{ij}x_i x_j \qquad (4\text{-}28)$$

$$E_{TL} = \langle\Psi|H_{TL}|\Psi\rangle = \langle\psi|\sum_{i=1}^{N} b_i\hat{\sigma}_i^z|\Psi\rangle = \sum_{i=1}^{N} b_i x_i \qquad (4\text{-}29)$$

Further, a mean field (also referred to as a local field) $h_m$ regarding a magnetic field of the spin m may be evaluated according to Equations (4-32) and (4-33).

$$h_m = v_m + b_m \quad (4\text{-}32)$$

$$v_m = \sum_{j=1}^{N} W_{mj} x_j \quad (4\text{-}33)$$

<Definition of Time Propagation Operator of Particle System>

The optimization apparatus 100 that executes the QTSA method computes time propagation of the quantum system. A time propagator of the Hamiltonian of the quantum system is described as U(t,t$_0$) (U with ^). A specific form of the Hamiltonian may be described by the following Equation (5-1).

$$|\Psi(t)\rangle = \hat{U}(t,t_0)|\Psi(t_0)\rangle \quad (5\text{-}1)$$

Here, the time propagator U(t,t$_0$) (U with ^) given by the following Equation (5-2).

$$\hat{U}(t, t_0) = T \exp\left\{-i \int_{t_0}^{t} \hat{H}(t) dt\right\} \quad (5\text{-}2)$$

In Equation (5-2), i is the imaginary unit, and T represents a time sequence product. The time sequence product is considered when the Hamiltonian depends on time. For example, as the time [t$_0$,t], it is considered to arrange the time in a time sequence as follows. In this case, sequentially applying the time propagator from the previous time as in Equation (5-3) is the time sequence product.

$$\hat{U}(t,t_0) = \hat{U}(t_0+(n-1)\Delta t, t_0+n\Delta t) \ldots \hat{U}(t_0+\Delta t, t_0+2\Delta t)\hat{U}(t_0, t_0+\Delta t) \quad (5\text{-}3)$$

When time propagation of a quantum system given by a Hamiltonian that changes depending on time is considered, it is difficult to directly evaluate a time propagator. However, from Equation (1-3) that is a definition equation of the problem, since the time propagation is performed with the transverse magnetic field fixed at the time of the imaginary time propagation, the time propagation may be performed only for the second time. Therefore, G$_1$ and G$_2$ may be handled as constants. Furthermore, the Ising Hamiltonian and the transverse magnetic field Hamiltonian do not depend on time. Thus, the optimization apparatus 100 approximates that the Hamiltonian is fixed with respect to time during [t$_0$,t$_0$+Δt] of the minute time Δt, and performs evaluation. Equation (5-2) may be approximated to the following Equation (5-4) during [t$_0$,t$_0$+Δt] of the minute time Δt.

$$\hat{U}(t_0,t_0+\Delta t) = \exp\{-i\hat{H}(t_0)\Delta t\} \quad (5\text{-}4)$$

In addition, in Equation (5-4), i is the imaginary unit.

<Evaluation Equations for First-Order and Second-Order Imaginary Time Operators>

Equation (5-4) is converted into an imaginary time to derive an approximate equation. When Equation (3-4) is defined as an imaginary time, Equation (5-4), which is a time propagator, becomes the following Equation (6-1).

$$\hat{U}(t_0,t_0+\Delta t) = \exp\{-\hat{H}(t_0)\Delta t\} \quad (6\text{-}1)$$

Equation (6-1) may be evaluated according to a method of dividing an operator (NPL 10). Here, the operators T (with ^) and V (with ^) are defined as follows.

$$\hat{T} = G_2 \hat{H}_0 \quad (6\text{-}2)$$

$$\hat{V} = G_1 \hat{H}_{TH} \quad (6\text{-}3)$$

Next, when the time propagator expressed in Equation (6-1) is evaluated in the first-order and second-order ranges, the following equations are obtained.

$$\hat{U}(t_0, t_0 + \Delta t) \cong \exp\{-\hat{T}\Delta t\}\exp\{-\hat{V}\Delta t\} + O(\Delta t^2) \quad (6\text{-}4)$$

$$\hat{U}(t_0, t_0 + \Delta t) \cong \exp\left\{-\frac{1}{2}\hat{T}\Delta t\right\}\exp\{-\hat{V}\Delta t\}\exp\left\{-\frac{1}{2}\hat{T}\Delta t\right\} + O(\Delta t^3) \quad (6\text{-}5)$$

Equation (6-5) is also referred to as a split-operator method. Next when Equation (6-4) is subjected to Taylor expansion and is evaluated, the following Equation (6-6) is obtained.

$$\hat{U}(\tau_0,\tau_0+\Delta\tau) \cong 1 - \hat{H}(\lambda,\tau_0)\Delta\tau + O(\Delta\tau^2) \quad (6\text{-}6)$$

When Equation (6-5), which is a second-order evaluation equation, is approximated with the accuracy of O(Δt$^3$), Equation (6-7) is obtained.

$$\hat{U}(\tau_0, \tau_0 + \Delta\tau) \cong \quad (6\text{-}7)$$
$$1 - \hat{H}(G_1, G_2)\Delta\tau + \frac{\Delta\tau^2}{2}\{\hat{T}^2 + \hat{V}^2 + \hat{T}\hat{V} + \hat{V}\hat{T}\} + O(\Delta\tau^3)$$

The operators obtained here are respectively first-order and second-order imaginary time propagation operators. With the initials of Imaginary Time Propagation, the first-order and second-order imaginary time propagation operators will be respectively referred to as first-order ITP and second-order ITP.

<Time Propagation Equation of Wave Function in QTSA Method>

Details of computation for quantum thermal annealing in the Ising model will be described below.

From Equation (5-1) and Equation (5-4), time propagation of a wave function during [t$_0$,t$_0$+Δt] of the minute time Δt is given by the following Equation (7-1) and Equation (7-2).

$$|\Psi(t_0 + \Delta t)\rangle = \hat{U}(t_0, t_0 + \Delta t)|\Psi(t_0)\rangle \quad (7\text{-}1)$$

When Equation (7-2) is assigned to Equation (7-1), the following Equation (7-3) is obtained.

$$|\Psi(\tau_0 + \Delta\tau)\rangle = \quad (7\text{-}3)$$
$$\left\{1 - \hat{H}(G_1, G_2)\Delta\tau + \frac{\Delta\tau^2}{2}\{\hat{T}^2 + \hat{V}^2 + \hat{T}\hat{V} + \hat{V}\hat{T}\}\right\}|\Psi(\tau_0)\rangle + O(\Delta\tau^3)$$

What is desired to be computed here is time propagation of a coefficient of each spin variable, Therefore, a differential equation according to $C_{m\alpha}(t)$ and $C_{m\beta}(t)$ is derived. When "$\langle\alpha_m|\times\langle\overline{\psi_m(\tau_0)}|$" (where × is a symbol in which a multiplication symbol is written in a circle, and m of $\psi_m(\tau_0)$ is overlined) is applied to the left side of Equation (7-3), the following Equation (7-4) is obtained. Current $\tau_0$ indicates an imaginary time.

$$\langle\alpha_m|\otimes\langle\Psi_m(\tau_0)|\Psi(\tau_0 + \Delta\tau)\rangle = C_{ma}(\tau_0 + \Delta\tau)\prod_{i=1, i\neq m}^{N}\{1 + M_i^*\Delta\tau\} \quad (7\text{-}4)$$

Here, $M_i^*$ is as follows.

$$M_i^* = C_{i\alpha}^*(\tau_0)\frac{dC_{i\alpha}(\tau_0)}{dt} + C_{i\beta}^*(\tau_0)\frac{dC_{i\beta}(\tau_0)}{dt} \quad (7\text{-}5)$$

$M_i^*$ is derived as follows. When the Taylor expansion is performed on the normalized integral of the one-particle wave function to the first order with respect to $\Delta\tau$, the following Equation (7-6) is established. From this, $M_i^*$ may be determined, $$\langle \varphi_i(\tau_0)|\varphi_i(\tau_0+\Delta\tau)\rangle = C_{i\alpha}^*(\tau_0)C_{i\alpha}(\tau_0+\Delta\tau) + C_{i\beta}^*(\tau_0)C_{i\beta}(\tau_0+\Delta\tau) \quad (7\text{-}6)$$

$$= |C_{i\alpha}(\tau_0)|^2 + |C_{i\beta}(\tau_0)|^2 + M_i^*\Delta\tau + O(\Delta\tau^2)$$

In addition, the physical analysis of $M_i^*$ decelerates or accelerates the temporal change of $C_i\alpha(\tau_0)$. Therefore, $M_i^*$ is an amount corresponding to the virtual inertial mass of a probability change of a spin. However, it may be indicated that a value of $M_i^*$ becomes "0" in a steady state as follows. The parameters change in an initial stage of the computation, but all the parameters converge to a certain value when the parameters converge to the ground state. Therefore, in the steady state, as expressed in Equation (7-7), the time differential converges to "0".

$$\frac{dC_{i\alpha}(\tau_0)}{dt} = 0 \quad (7\text{-}7)$$

$$\frac{dC_{i\beta}(\tau_0)}{dt} = 0$$

Therefore, the following Equation (7-8) is established.

$$\lim_{\tau \to \infty} M_i^* = 0 \quad (7\text{-}8)$$

In other words, a term including $M_i^*$ is a term that is to finally converge to "0". Thus, the optimization apparatus 100 employs approximation as in the following Equation (7-9) in the computation of the QTSA method.

$$M_i^* = 0 \quad (7\text{-}9)$$

Here, the physical meaning of approximation in Equation (7-9) will be described. In the computation with $M_i^*=0$, it is assumed that all spins other than a target spin are frozen at the time point, and time propagation is performed in an interaction field formed by the spins. This is a kind of frozen core approximation.

In the QTSA method, as long as convergence to a final state occurs, an intermediate path has only to efficiently drop energy to the ground state, and thus approximation in Equation (7-9) is effective. Furthermore, in a situation where the frozen core approximation is favorably established, the dynamics of the quantum system may be favorably approximated through the frozen core approximation. This approximation assumes that a final state converges to the ground state, and is consistent in a stable quantum state including the ground state.

In the frozen core approximation, the wave function may be represented by the following Equation (7-10).

$$\langle \alpha_m | \otimes \langle \Psi_{\bar{m}}(\tau_0) | \Psi(\tau_0+\Delta\tau) \rangle = C_{m\alpha}(\tau_0+\Delta\tau)$$

$$\langle \beta_m | \otimes \langle \Psi_{\bar{m}}(\tau_0) | \Psi(\tau_0+\Delta\tau) \rangle = C_{m\beta}(\tau_0+\Delta\tau) \quad (7\text{-}10)$$

Next, the degree of freedom of the problem will be described. Parameters defined as being observable are an observation probability $|C_{m\alpha}(\tau_0)|^2$ of an upward spin, an observation probability $|C_{m\beta}(\tau_0)|^2$ of a downward spin, and a magnetization expected value "$x_m \langle \varphi_m(t) \sigma_m^z | \varphi_m(t)\rangle$" ($\sigma$ with $\hat{\ }$).

Here, the physical analysis of the above Equation (4-14) is as follows. $|C_{m\alpha}(\tau_0)|^2$ is a probability that an m-th particle may be observed in the upward spin $|\alpha_m\rangle$. $|C_{m\beta}(\tau_0)|^2$ is a probability that the m-th particle is observed in the downward spin $|\beta_m\rangle$. Furthermore, eigenvalues of magnetization are assumed to be "1" and "0". Therefore, Equation (4-14) represents a probability that an i-th particle is observed in the state $|\alpha\rangle$.

Therefore, $|\alpha\rangle$ and $|\beta\rangle$ are not independent from each other. When one thereof is determined, the other is determined.

When "$\langle\alpha|\times\langle\overline{\psi_k}(t)|$ and $\langle\beta|\times\langle\overline{\psi_k}(\tau_0)|$" ($\times$ is a symbol in which a multiplication symbol is written in a circle, and k of $\psi_k(t)$ and $\psi_k(\tau_0)$ is overlined) are applied to Equation (6-5) from the left side, the following Equation (7-11) is obtained.

$$\begin{pmatrix} C_{m\alpha}(\tau+\Delta\tau) \\ C_{m\beta}(\tau+\Delta\tau) \end{pmatrix} = \begin{pmatrix} H_{2,\alpha\alpha} & H_{2,\alpha\beta} \\ H_{2,\alpha\beta} & H_{2,\beta\beta} \end{pmatrix} \begin{pmatrix} C_{m\alpha}(\tau) \\ C_{m\beta}(\tau) \end{pmatrix} \quad (7\text{-}11)$$

Here, the Hamiltonian included in Equation (7-11) is as follows. In addition, details of derivation of the Hamiltonian included in Equation (7-11) will be described later (refer to <Derivation of Integral of Hamiltonian>).

$$H_{2,\alpha\alpha} \cong 1 - \Delta\tau H_{1,\alpha\alpha} + \frac{\Delta\tau^2}{2}(G_1^2 D_{\alpha\alpha} + G_1 G_2 \Theta_{\alpha\alpha} + G_2^2 \Lambda_{\alpha\alpha}) \quad (7\text{-}12)$$

$$H_{2,\beta\beta} \cong 1 - \Delta\tau H_{1,\beta\beta} + \frac{\Delta\tau^2}{2}(G_1^2 D_{\beta\beta} + G_1 G_2 \Theta_{\beta\beta} + G_2^2 \Lambda_{\beta\beta}) \quad (7\text{-}13)$$

$$H_{2,\alpha\beta} \cong H_{2,\beta\alpha} \cong -\Delta\tau H_{1,\alpha\beta} + \frac{\Delta\tau^2}{2}(G_1 G_2 \Theta_{\alpha\beta} + G_2^2 \Lambda_{\alpha\beta}) \quad (7\text{-}14)$$

$\Lambda_{\alpha\alpha}$, $\Lambda_{\beta\beta}$, and $\Lambda_{\alpha\beta}$ are elements obtained from the operator $T^2$ (with $\hat{\ }$), $\Theta_{\alpha\alpha}$, $\Theta_{\beta\beta}$, and $\Theta_{\alpha\beta}$ are elements obtained from the operator "TV+VT" (both T and V are added with $\hat{\ }$). Here, the first-order term is computed from $H_{1,\alpha\alpha}$, $H_{1,\beta\beta}$, and $H_{1,\alpha\beta}$, and is as follows.

$$H_{1,\alpha\alpha} = G_1(E_{TH}+(1-x_m)h_m)+G_2(E_{OL}-J_m y_m) \quad (7\text{-}15)$$

$$H_{1,\beta\beta} = G_1(E_{TH}-x_m h_m)+G_2(E_{OL}-J_m y_m) \quad (7\text{-}16)$$

$$H_{1,\alpha\beta} = H_{1,\beta\alpha} = G_2 J_m \quad (7\text{-}17)$$

Here, since the first-order term is an operator of the first-order ITP, when the first-order ITP is computed, the computation may be performed by ignoring the second-order term. When the second-order ITP is computed, the following second-order term is evaluated. Here, $D_{\alpha\alpha}$ and $D_{\beta\beta}$ are elements obtained from the operator $V^2$ (with $\hat{\ }$).

$$D_{\alpha\alpha} = \{E_{TH}+(1-x_m)h_m\}^2 \quad (7\text{-}18)$$

$$D_{\beta\beta} = \{E_{TH}-x_m h_m\}^2 \quad (7\text{-}19)$$

When it is considered that $\sigma_i^x$ (with $\hat{\ }$) represents a magnetic field in an X axis direction, $\Lambda_{\alpha\alpha}$, $\Lambda_{\beta\beta}$, and $\Lambda_{\alpha\beta}$ are interactions corresponding to the XX type interaction in NPL 6 and are represented by the following equations (7-20) and (7-21).

$$\Lambda_{\alpha\alpha} = \Lambda_{\beta\beta} = (E_{CL}-J_m y_m)^2 + J_m^2 \quad (7\text{-}20)$$

$$\Lambda_{\alpha\beta} = \Lambda_{\beta\alpha} = 2J_m(E_{OL}-J_m y_m) \quad (7\text{-}21)$$

When it is considered that $\sigma_i^z$ (with ^) represents a magnetic field in a Z axis direction, $\Theta_{\alpha\alpha}$, $\Theta_{\beta\beta}$, and $\Theta_{\alpha\beta}$ are terms representing a binding interaction between X and Z such as XZZ, XZ, ZZX, ZX and are represented by the following Equations (7-22), (7-23), and (7-24).

$$\Theta_{\alpha\alpha}=2(E_{0L}-J_m y_m)\{E_{TH}+(1-x_m)h_m\}+J_m y_m x_m v_m \quad (7\text{-}22)$$

$$\Theta_{\beta\beta}=2(E_{0L}-J_m y_m)\{E_{TH}-x_m h_m\}+J_m y_m x_m v_m \quad (7\text{-}23)$$

$$\Theta_{\alpha\beta}=\Theta_{\beta\alpha}=J_m\{2(E_{TH}-x_m h_m)+h_m\} \quad (7\text{-}24)$$

In other words, in the first-order ITP, the transverse magnetic field term is a non-diagonal term, and thus mixing of the $|\alpha\rangle$ spin and the $|\beta\rangle$ spin occurs. In the second-order ITP, mixing of the transverse magnetic field term and the longitudinal magnetic field term occurs, and a spin flip is described as a function of time. That is, the spin flip is caused by the presence of the transverse magnetic field term.

Next, a renormalization timing and physical meaning will be described. Since time is set to an imaginary number, an equation system becomes a non-unitary system. Even with imaginary time propagation performed once, an observation probability given by the square of a wave function is certainly reduced from "1". Here, a problem here is that it is appropriate to compensate for the probability reduced due to time propagation performed once each time. Several renormalization methods are conceivable. In this method, renormalization is performed as follows whenever time propagation is performed. Assuming that a wave function in the real time t is normalized, the following Equation (7-25) is established.

$$|C_{m\alpha}(t)|^2+|C_{m\beta}(t)|^2=1 \quad (7\text{-}25)$$

A wave function after the imaginary time propagation does not satisfy the normalization condition, and is expressed by the following Expression (7-26).

$$|C_{m\alpha}(t+\Delta t)|^2+|C_{m\beta}(t+\Delta t)|^2\neq 1 \quad (7\text{-}26)$$

Therefore, $\gamma_m$ is defined as a normalization constant as follows.

$$\tilde{C}_{m\alpha}(t+\Delta t)=\gamma_m C_{m\alpha}(t+\Delta t) \quad (7\text{-}27)$$

$$\tilde{C}_{m\beta}(t+\Delta t)=\gamma_m C_{m\beta}(t+\Delta t) \quad (7\text{-}28)$$

Here, $C_{m\alpha}(t+\Delta t)$ (C is added with ~) and $C_{m\beta}(t+\Delta t)$ (C is added with ~) are coefficients of wave functions after renormalization, and the following Equation (7-29) is satisfied.

$$|\tilde{C}_{m\alpha}(t+\Delta t)|^2+|\tilde{C}_{m\beta}(t+\Delta t)|^2=1 \quad (7\text{-}29)$$

Therefore, $\gamma_m$ may be obtained according to the following Equation (7-30).

$$\gamma_m = \frac{1}{\sqrt{|C_{m\alpha}(t+\Delta t)|^2 + |C_{m\beta}(t+\Delta t)|^2}} \quad (7\text{-}30)$$

When the Hamiltonian is computed while performing the imaginary time propagation and renormalizing the Hamiltonian such that the normalized integral is "1" at all times, the energy has a lower bound. The renormalization is performed to ensure that energy has a lower bound. In addition, in the imaginary time propagation, since the Schrödinger equation is a diffusion equation, the energy basically tends to decrease. Thus, it is guaranteed that the minimum value (that is, the ground state) of energy having a lower bound is reached at the limit of the imaginary time infinity.

<Selection of Relaxation Time Constant>

The optimization apparatus 100 solves Equation (7-11) in the QTSA method. Here, determination of the time step width $\Delta\tau$ of the imaginary time remains as an important problem. Commonly, the selection may be performed to satisfy $\Delta\tau\ll 1$, but, when $\Delta\tau$ is too small, the computation time increases. On the other hand, when $\Delta\tau$ is too large, a problem occurs in convergence. Therefore, the imaginary time is redefined as in the following Equation (8-1).

$$\tau=\zeta\tau' \quad (8\text{-}1)$$

The coefficient $\zeta$ in Equation (8-1) is called a time constant. In Equation (7-11), since the diagonal term is sufficiently larger than the non-diagonal term, for example, the following value may be taken based on $H_{1,\alpha\alpha}$ of the diagonal term.

$$\zeta \approx \frac{1}{|H_{1,\alpha\alpha}|} \quad (8\text{-}2)$$

This method is a method called a variable time step method. According to this method, in a region where a change in a variable to be computed is great, it is possible to reduce a time step and suppress a change amount to a fixed value. On the other hand, in a region where the change in the variable to be computed is small, there is no problem even when a time step is increased, and it is possible to secure a time step width to the extent that a change amount of the variable to be computed is fixed. In the above-described way, temporal change amounts of variables to be computed are maintained at the same level in all computation steps.

<Easiness of Spin Exchange>

When the QA method is solved according to an atomic physical approach, the dynamics of spin exchange are important. If the system ends up in the ground state, the easiness of inversion may be evaluated for each spin. Therefore, hereinafter, an evaluation equation for the easiness of inversion for each spin will be considered.

In the first-order ITP, a non-diagonal term is $H_{1,\alpha\beta}=H_{1,\beta\alpha}=G_2 J_m$. This indicates that, in the first-order ITP, the easiness of spin inversion is expressed as a constant. Therefore, this indicates that the easiness of the spin inversion is determined by the transverse magnetic field intensity $J_m$. When second-order ITP is taken, a non-diagonal term is given by Equation (7-14). Therefore, when the second-order ITP is converted into the same format as the first-order ITP, the following Equation (9-1) is obtained.

$$\tilde{J}_m \cong J_m\{1-\Delta\tau g_{\alpha\beta}^{(m)}\}$$

$$g_{\alpha\beta}^{(m)}\cong g_{\alpha\beta}^{(m)}(G_1, G_2, h_{zm}, x_m, J_m, y_m) \quad (9\text{-}1)$$

Here, $g_{\alpha\beta}^{(m)}$ is specifically represented by the following Equation (9-2).

$$g_{\alpha\beta}^{(m)} = (E(G_1, G_2)) + G_1\left(\frac{1}{2}-x_m\right)h_m - G_2 J_m y_m \quad (9\text{-}2)$$

The physical meaning of $J_m$ (with ~) in Equation (9-1) is an effective magnetic field applied to each spin. When the spin is affected by all other spins interacting with the spin, the influence of other spin states becomes the effective magnetic field intensity of the spin in addition to the external field. In the above-described way, the effective magnetic field applied to each spin may also be computed.

<Method of Selecting Initial State>

The optimization apparatus 100 selects an initial state by assuming a state in which the initial state is experimentally prepared. The optimization apparatus 100 selects a case where only a transverse magnetic field term exists first. The optimization apparatus 100 is assumed to select, for example, the following initial states.

$$\Psi_{t1} = |\alpha\rangle \otimes |\alpha\rangle \otimes |\alpha\rangle \ldots \otimes |\alpha\rangle \quad (10\text{-}1)$$

$$\Psi_{t2} = |\beta\rangle \otimes |\beta\rangle \otimes |\beta\rangle \ldots \otimes |\beta\rangle \quad (10\text{-}2)$$

$$\Psi_{su\pm} = \frac{1}{\sqrt{2}}\{|\alpha\rangle - \beta\rangle\} \otimes \frac{1}{\sqrt{2}}\{|\alpha\rangle - \beta\rangle\} \otimes \ldots \otimes \frac{1}{\sqrt{2}}\{|\alpha\rangle - |\beta\rangle\} \quad (10\text{-}3)$$

$$\Psi_{tb\pm} = \frac{1}{\sqrt{2}}\{|\alpha\rangle + \beta\rangle\} \otimes \frac{1}{\sqrt{2}}\{|\alpha\rangle + \beta\rangle\} \otimes \ldots \otimes \frac{1}{\sqrt{2}}\{|\alpha\rangle + |\beta\rangle\} \quad (10\text{-}4)$$

Furthermore, the optimization apparatus 100 may also randomly select the $|\alpha\rangle$ spin and the $|\beta\rangle$ spin. Although any initial state is selected, the optimization apparatus 100 takes, for example, the initial Hamiltonian as the transverse magnetic field Hamiltonian. Alternatively, the optimization apparatus 100 sets the initial state to a situation in which the transverse magnetic field Hamiltonian is dominant. In order to accelerate convergence of imaginary time propagation, it is preferable to select a ground state of the transverse magnetic field Hamiltonian as the initial state.

<Derivation of Integral of Hamiltonian>

A process of deriving the integral of the Hamiltonian will be described below. Since the number of terms is large with respect to evaluation of the integral, an evaluation method will be used. When a certain operator A (with ^) is given, the following integral is considered.

$$\langle \psi(\tau_0)|\hat{A}|\Psi(\tau_0)\rangle = C'^*_{m\alpha}\langle \alpha_k|\otimes\langle \Psi_{\bar{k}}(\tau_0)|\hat{A}| \Psi(\tau_0)\rangle + C_{m\beta}'^*\langle \beta_k|\otimes\langle \Psi_{\bar{k}}(\tau_0)|\hat{A}|\Psi(\tau_0)\rangle \quad \text{(A-1)}$$

Here, $|\psi(\tau_0)\rangle$ is a wave function used for imaginary time propagation. $\langle\psi(\tau_0)|$ is a wave function slightly different therefrom, and an Rh wave function is given by Equation (A-2).

$$\rangle \phi_i(t)| = C_{i\alpha}'^*(t)\langle\alpha| + C_{i\beta}'^*(t)\langle\beta| \quad \text{(A-2)}$$

In this case, for the coefficients $\langle\alpha_k|\times\langle\psi_{\bar{k}}(\tau_0)|A|\psi(\tau_0)\rangle$ and $\langle\beta_k|\times\langle\psi_{\bar{k}}(\tau_0)|A|\psi(\tau_0)\rangle$ desired to be obtained from Equation (A-1), the following equation is established (× is a symbol in which a multiplication symbol is written in a circle, k of $\psi_k(\tau_0)$ is overlined, and A is added with ^).

$$\begin{pmatrix}\langle\alpha_k|\otimes\langle\Psi_{\bar{k}}(\tau_0)|\hat{A}|\Psi(\tau_0)\rangle \\ \langle\beta_k|\otimes\langle\Psi_{\bar{k}}(\tau_0)|\hat{A}|\Psi(\tau_0)\rangle\end{pmatrix} = (C_{m\alpha}'^* \; C_{m\beta}'^*)\begin{pmatrix}A_{\alpha\alpha} & A_{\alpha\beta} \\ A_{\beta\alpha} & A_{\beta\beta}\end{pmatrix}\begin{pmatrix}C_{m\alpha} \\ C_{m\beta}\end{pmatrix} \quad \text{(A-3)}$$

Therefore, the problem becomes a problem of obtaining matrix elements in a case of conversion into a matrix format, Next, equations based on expected values of operators frequently used in computation will be described. These equations are used to obtain a matrix format in specific computation.

$$O_m = \langle\phi_m(t)|\hat{1}|\phi_m(t)\rangle = (C_{m\alpha}'^* \; C_{m\beta}'^*)\begin{pmatrix}1 & 0 \\ 0 & 1\end{pmatrix}\begin{pmatrix}C_{m\alpha} \\ C_{m\beta}\end{pmatrix} \quad \text{(A-4)}$$

-continued $$p_m = \langle\phi_m(t)|\hat{\sigma}_m^z|\phi_m(t)\rangle = (C_{m\alpha}'^* \; C_{m\beta}'^*)\begin{pmatrix}1 & 0 \\ 0 & 0\end{pmatrix}\begin{pmatrix}C_{m\alpha} \\ C_{m\beta}\end{pmatrix} \quad \text{(A-5)}$$

$$t_m = \langle\phi_m(t)|\hat{\sigma}_m^x|\phi_m(t)\rangle = (C_{m\alpha}'^* \; C_{m\beta}'^*)\begin{pmatrix}0 & 1 \\ 1 & 0\end{pmatrix}\begin{pmatrix}C_{m\alpha} \\ C_{m\beta}\end{pmatrix} \quad \text{(A-6)}$$

Next, a specific computation method will be described. The subsequent results are given as a list, but a computation method is the same.

<<First Computation Example>>

As a first example, an example of a transverse magnetic field operator will be described. The integral to be obtained is related to Equation (A-7), $$\langle\psi|\hat{H}_0|\Psi\rangle = \langle\psi|\sum_{i=1}^{N} J_i\hat{\sigma}_i^x|\Psi\rangle = \sum_{i=1}^{N} J_i\langle\psi|\hat{\sigma}_i^x|\Psi\rangle \quad \text{(A-7)}$$

As case classification, it is assumed that not all variables are m (target spin). In this case, a multiple sum such as i≠m is obtained, but, when other terms are processed, i≠m disappears, and thus a sum with i=m is obtained. This term will be referred to as a principal term.

In the case of i≠m, individual terms of the operator are given by Equation (A-8). In addition, in Equation (A-8), two types of φ having different character shapes are used, and φ having different character shapes are different elements (the same applies to Equation (A-10)).

$$J_i\langle\phi_m|\phi_m\rangle\langle\phi_i|\hat{\sigma}_i^x|\phi_i\rangle = J_iO_my_i \quad \text{(A-8)}$$

Therefore, a sum is given by Equation (A-9).

$$S_1 = O_m\sum_{i\neq m}^{N} J_iy_i \quad \text{(A-9)}$$

In a case of i=m, each term of the operator is as follows.

$$J_m t_m \quad \text{(A-10)}$$

Here, the following operations are performed.

$$J_m t_m = J_m O_m y_m + J_m t_m - J_m O_m y_m \quad \text{(A-11)}$$

In the above-described way, a final sum is given by Equation (A-12).

$$\langle\psi|\hat{H}_0|\Psi\rangle = O_m E_{0L} + J_m t_m - J_m O_m y_m \quad \text{(A-12)}$$

An order of applying the operators is considered through the case classification as described above. In addition, in consideration of the excluded portion, the final sum may be represented by using an expected value of energy. Next, when $O_m$ and $t_m$ are expressed in a matrix format, the following Equations (A-13) and (A-14) are obtained.

$$O_m E_Q = (C_{m\alpha}'^* \; C_{m\beta}'^*)\begin{pmatrix}E_Q & 0 \\ 0 & E_Q\end{pmatrix}\begin{pmatrix}C_{m\alpha} \\ C_{m\beta}\end{pmatrix} \quad \text{(A-13)}$$

$$t_m = (C_{m\alpha}'^* \; C_{m\beta}'^*)\begin{pmatrix}0 & J_m \\ J_m & 0\end{pmatrix}\begin{pmatrix}C_{m\alpha} \\ C_{m\beta}\end{pmatrix} \quad \text{(A-14)}$$

Therefore, the following Equation (A-15) is obtained.

$$\langle\psi|\hat{H}_Q|\Psi\rangle = (C_{m\alpha}'^* \; C_{m\beta}'^*)\begin{pmatrix}E_{0L} - J_my_m & J_m \\ J_m & E_{0L} - J_my_m\end{pmatrix}\begin{pmatrix}C_{m\alpha} \\ C_{m\beta}\end{pmatrix} \quad \text{(A-15)}$$

<<Second Computation Example>>

As a second example, a computation example for a second-order element of the longitudinal magnetic field term will be described. An integral to be obtained is related to the following Equation (A-16).

$$\langle\psi|\hat{H}_Q|\Psi\rangle = \left\langle\psi\left|\sum_{j>1}^{N} W_{ij}\hat{\sigma}_i^z\hat{\sigma}_j^z\right|\Psi\right\rangle = \frac{1}{2}\sum_{i,j=2}^{N} W_{ij}\langle\psi|\hat{\sigma}_i^z\hat{\sigma}_j^z|\Psi\rangle \quad \text{(A-16)}$$

Here, it is assumed that Equation (A-17) indicating an integral is evaluated.

$$\sum_{i,j=1}^{N} W_{ij}\langle\psi|\hat{\sigma}_i^z\hat{\sigma}_j^z|\Psi\rangle \quad \text{(A-17)}$$

The evaluation of Equation (A-17) may be computed through case classification as in the first computation example.

In a case of i≠m and j≠m, coefficients of the individual terms are expressed by Expression (A-18).

$$W_{ij}O_m x_i x_j \quad \text{(A-18)}$$

Therefore, Equation (A-19) obtained as a finally remaining term from this term.

$$O_m\sum_{i,j=1}^{N} W_{ij}x_i x_j = O_m(2E_Q) \quad \text{(A-19)}$$

The term expressed in Equation (A-19) will be referred to as a principal term.

In a case of (i,j)=(m,j) and (i,m), only one pattern of two patterns is considered. The remaining patterns are the same as each other because of the symmetry of $W_{ij}=W_{ji}$. Therefore, the pattern of (m,j) is considered. In this case, a coefficient is $W_{mj}|o_m x_j$. Therefore, when the coefficient is divided into a portion that is renormalized into the principal term and residual terms corresponding to a portion that is not renormalized, the coefficient is expressed by the following Equation (A-20).

$$W_{mj}p_m x_j = W_{mj}O_m x_m x_j + W_{mj}p_m x_j - W_{mj}O_m x_m x_j \quad \text{(A-20)}$$

Therefore, when a sum is taken, since the first term on the right side of Equation (A-14) is incorporated into Equation (A-13) of the principal term to be ignored, it is sufficient to take a sum of only the residual terms. Therefore, Equation (A-21) is obtained.

$$\Delta S = 2p_m\sum_{j\neq m}^{N} W_{mj}x_j - 2O_m x_m\sum_{j\neq m}^{N} W_{mj}x_j = 2p_m v_m - 2O_m x_m v_m \quad \text{(A-21)}$$

Finally, in a case of (i,j)=(m,m), since $W_{mm}=0$, there is no contribution from this term. Therefore, a finally obtained sum is expressed by Equation (A-22).

$$\langle\psi|\hat{H}_Q|\Psi\rangle = \frac{1}{2}\sum_{i,j=1}^{N} W_{ij}\langle\psi|\hat{\sigma}_i^z\hat{\sigma}_j^z|\Psi\rangle = O_m E_Q + p_m v_m - O_m x_m v_m \quad \text{(A-22)}$$

In addition, Equation (A-23) is obtained as a final sum. Hereinafter, computation may be performed in the same manner. Herein, a list of results is described.

$$\langle\psi|\hat{H}_Q|\Psi\rangle = \begin{pmatrix} C'^*_{m\alpha} & C'^*_{m\beta}\end{pmatrix}\begin{pmatrix} E_Q+(1-x_m)v_m & 0 \\ 0 & E_Q - x_m v_m \end{pmatrix}\begin{pmatrix} C_{m\alpha} \\ C_{m\beta}\end{pmatrix} \quad \text{(A-23)}$$

Through the above-described computation, the optimization apparatus 100 may efficiently obtain a solution to the minimum value solution problem according to the QTSA method.

<Installation of QTSA Method in Optimization Apparatus>

Next, functions of the optimization apparatus 100 that solves the minimum value solution problem according to the QTSA method will be described in detail.

Figure 4:
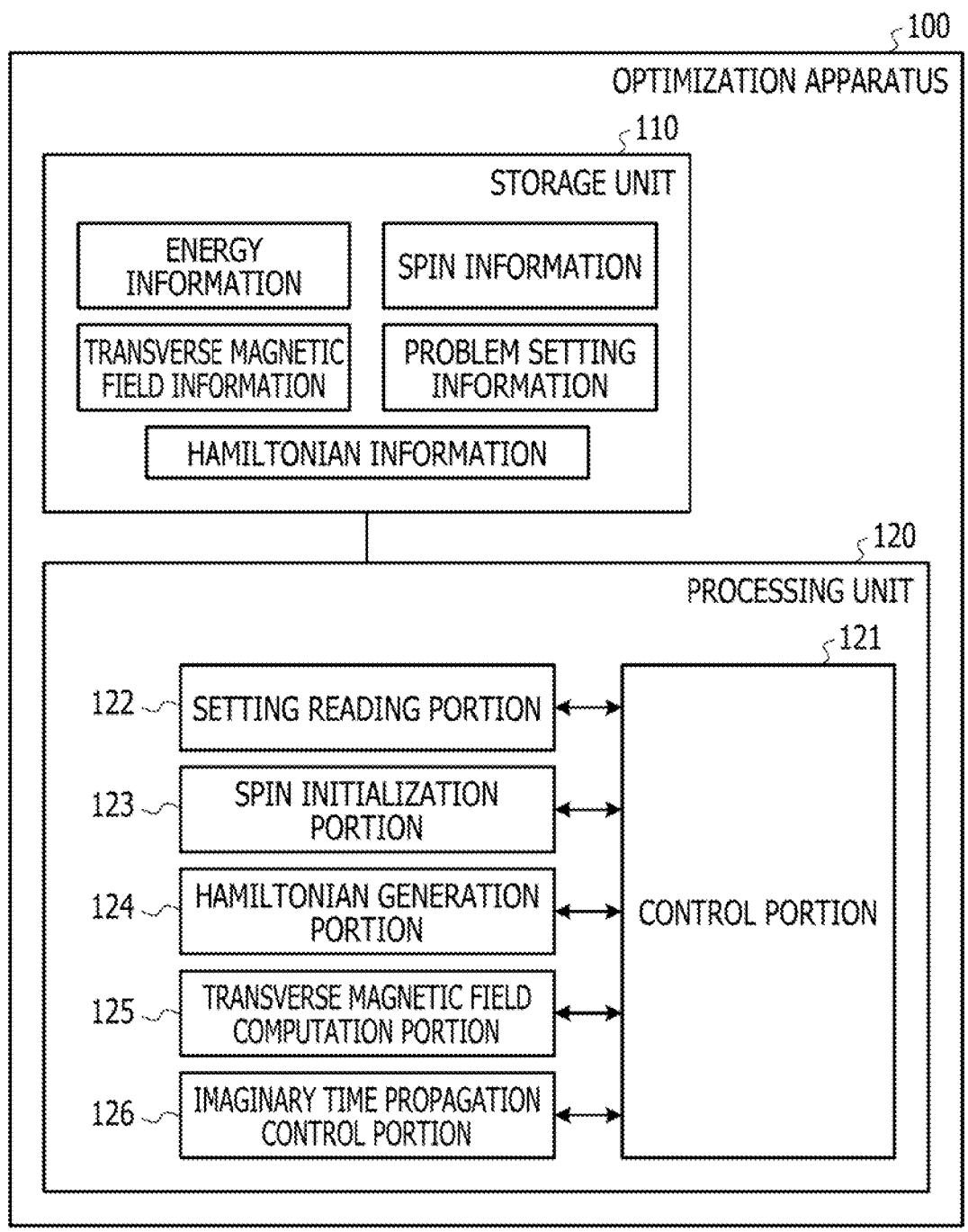
FIG. 4 is a block diagram illustrating functions of the optimization apparatus.

FIG. 4 is a block diagram illustrating functions of the optimization apparatus. The optimization apparatus 100 includes a storage unit 110 and a processing unit 120. The storage unit 110 is implemented by, for example, a part of a storage region of the memory 102 or the storage device 103s The processing unit 120 is implemented by causing the processor 101 to execute, for example, a predetermined program.

The storage unit 110 stores energy information, spin information, transverse magnetic field information, problem setting information, and Hamiltonian information.

The energy information includes a computed initial value of energy or a predetermined number of energy values in ascending order from the minimum value among energy values computed hitherto. Furthermore, the energy information may include combinations of values of state variables respectively corresponding to the predetermined number of energy values. The spin information includes a value of each state variable or designation information for a spin initialization method. The transverse magnetic field information includes information regarding an intensity of a transverse magnetic field applied to the system. The problem setting information includes, for example, information indicating a problem to be solved, an optimization method (such as the SA method or the QTSA method) to be used, various parameters used to execute the optimization method, and a computation end condition. The Hamiltonian information includes, for example, the weight coefficient ($W_{ij}$), the bias coefficient ($b_i$), and the constant (C) of the energy function expressed in Equation (1-1).

The processing unit 120 includes a control portion 121, a setting reading portion 122, a spin initialization portion 123, a Hamiltonian generation portion 124, a transverse magnetic field computation portion 125, and an imaginary time propagation control portion 126.

The control portion 121 controls each portion of the processing unit 120 and performs a minimum value solution process.

The setting reading portion 122 reads the various pieces of information from the storage unit 110 in the form understandable by the control portion 121.

The spin initialization portion 123 initializes a plurality of spin states included in the Ising model. The spin initialization portion 123 stores spin information including values of state variables indicating the initialized spin states into the storage unit 110.

The Hamiltonian generation portion 124 generates Hamiltonian information indicating the Hamiltonian of the Ising model for solving a problem to be solved, based on the problem setting information. The Hamiltonian generation portion 124 stores the generated Hamiltonian into the storage unit 110.

The transverse magnetic field computation portion 125 computes a transverse magnetic field that is updated due to real time propagation.

The imaginary time propagation control portion 126 controls imaginary time propagation. For example, the imaginary time propagation control portion 126 advances the imaginary time by the time step width $\Delta\tau$ of the imaginary time whenever a spin state is computed in a state in which the transverse magnetic field is fixed.

In addition, the lines coupling the elements illustrated in FIG. 4 indicate some communication paths, and a communication path other than the communication paths illustrated in FIG. 4 may be set. Furthermore, the function of each of the elements illustrated in FIG. 4 may be realized, for example, by causing a computer to execute a program module corresponding to the element.

Figure 5:
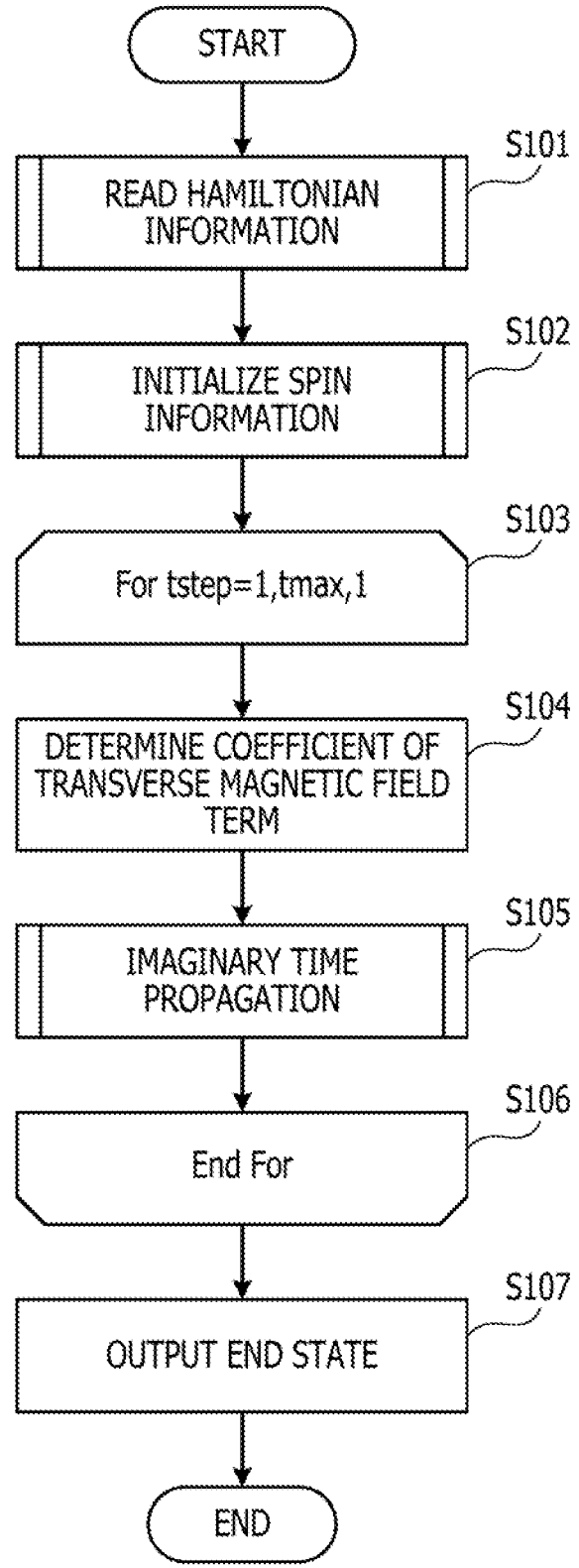
FIG. 5 is a flowchart illustrating an example of a solution retrieval procedure.

Next, a solution retrieval procedure for the minimum value solution problem using the QTSA method in the optimization apparatus 100 will be described, FIG. 5 is a flowchart illustrating an example of a solution retrieval procedure. Hereinafter, a process illustrated in FIG. 5 will be described along step numbers.

[Step S101] The control portion 121 performs a process of reading the Hamiltonian information from the storage unit. Details of this process will be described later (refer to FIG. 6).

[Step S102] The spin initialization portion 123 initializes spin information. For example, the spin initialization portion 123 reads designation information indicating a spin initialization method designated by a user from the storage unit 110. The spin initialization method includes, for example, a designation mode, a binding mode, an anti-binding mode, and a random mode. The designation mode is an initialization method of setting a spin state as designated by the user. The binding mode is an initialization method of making signs of coefficients of the state of |1> and the state of |0> in each spin the same as each other. The anti-binding mode is an initialization method of making signs of coefficients of the state of |1> and the state of |0> in each spin reverse to each other. In a case where any of the spin initialization methods such as the designation mode, the binding mode, and the anti-binding mode is designated by the user, the spin initialization portion 123 initializes the spin information according to the designated initialization method. The random mode is an initialization method of stochastically setting all spins upward or downward. In a case of the random mode, the spin initialization portion 123 sets an upward probability and a downward probability to 50% each, so that upward spins and downward spins may be set to half each. Details of the spin information initialization process will be described later (refer to FIG. 7).

[Step S103] The control portion 121 repeatedly executes the processes in steps S104 and S105 until an end condition is satisfied. For example, the control portion 121 sets a preset number of times of repeated computation to tmax. Moreover, the control portion 121 sequentially counts up a variable tstep indicating the number of repetitions from 1 by one whenever the processes in steps S104 and S105 are executed once. While a value of tstep is equal to or smaller than tmax, the control portion 121 repeatedly executes the processes in steps S104 and S105.

[Step S104] The transverse magnetic field computation portion 125 determines a value of the coefficient $G_2$ of the transverse magnetic field term. For example, the transverse magnetic field computation portion 125 sets an initial value of $G_2$ to "1", and decreases the value of $G_2$ by a predetermined amount whenever the processes in steps S104 and S105 are repeatedly executed. The transverse magnetic field computation portion 125 sets a value of $G_2$ to "0" when a value of tstep becomes tmax.

[Step S105] The imaginary time propagation control portion 126 performs an imaginary time propagation process. A ground state of the Hamiltonian in the current transverse magnetic field is obtained through the imaginary time propagation process. Details of the imaginary time propagation process will be described later (refer to FIG. 8).

[Step S106] In a case where the end condition of the repetitive process is satisfied, the control portion 121 causes the process to proceed to step S107. For example, in a case where a value of tstep is the same as tmax at the end of the process in step S105, the control portion 121 determines that the end condition is satisfied.

[Step S107] The control portion 121 outputs an end state. For example, the control portion 121 outputs a combination of the ground state (optimum value) of the Hamiltonian and a state variable in the ground state when a value of the coefficient $G_2$ of the transverse magnetic field is "0".

In the above-described way, the intensity of the transverse magnetic field is gradually reduced while repeatedly executing the imaginary time propagation process, and thus it is possible to obtain a combination of state variables that may cause an optimum value of the system to be obtained. The obtained combination of the state variables is a solution to the minimum value solution problem.

Next, the Hamiltonian information reading process will be described in detail.

Figure 6:
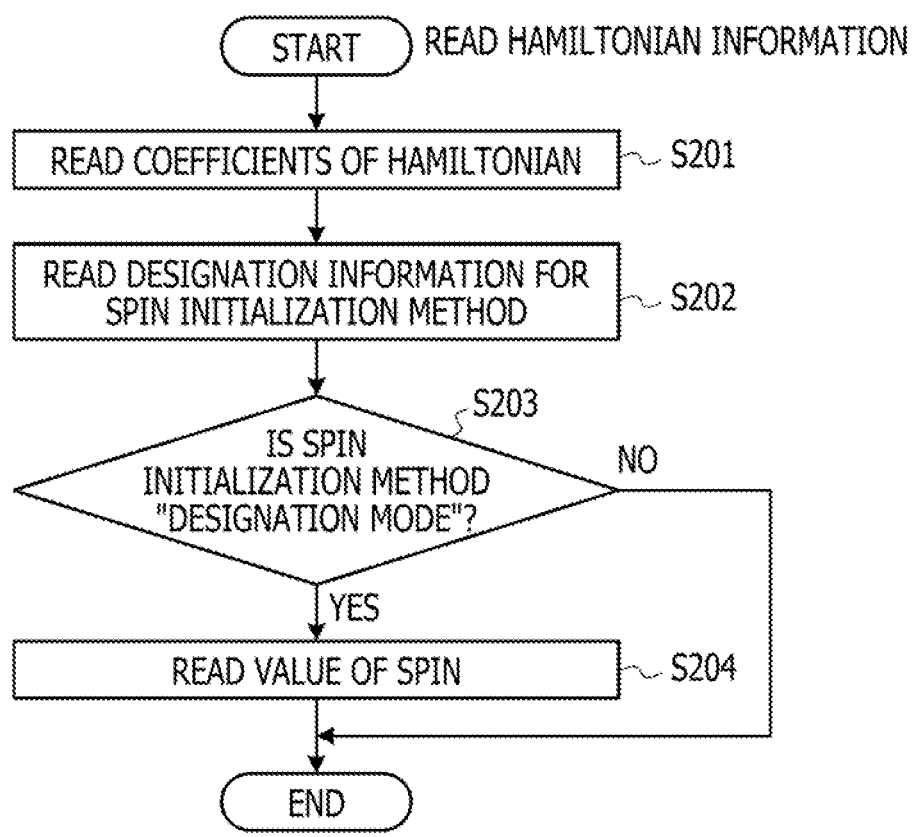
FIG. 6 is a flowchart illustrating an example of a procedure of a Hamiltonian information reading process.

FIG. 6 is a flowchart illustrating an example of a procedure of the Hamiltonian information reading process. Hereinafter, the process illustrated in FIG. 6 will be described along step numbers.

[Step S201] The control portion 121 reads, from the storage unit 110, the coefficients $W_{ji}$ and $b_i$ and the constant C of the Hamiltonian to be solved. In this case, the control portion 121 also reads, from the storage unit 110, various parameters used for computation in the QTSA method. For example, in a case where the imaginary time step width $\Delta\tau$ is designated in advance, the control portion 121 reads a value of $\Delta\tau$. In addition, when a variable time step is used as the imaginary time step width $\Delta\tau$, it is unnecessary to read the imaginary time step width $\Delta\tau$ since $\Delta\tau$ is computed based on Equations (8-1) and (8-2).

[Step S202] The spin initialization portion 123 reads designation information for a spin initialization method.

[Step S203] The spin initialization portion 123 determines whether or not the spin initialization method is the designation mode. In a case of the designation mode, the spin initialization portion 123 causes the process to proceed to step S204. Furthermore, in a case where the designation mode is not set, the spin initialization portion 123 finishes the Hamiltonian information reading process.

[Step S204] The spin initialization portion 123 reads a value of a spin designated by the user from the storage unit 110. Thereafter, the spin initialization portion 123 finishes the Hamiltonian information reading process.

Next, the spin information initialization process will be described in detail.

Figure 7:
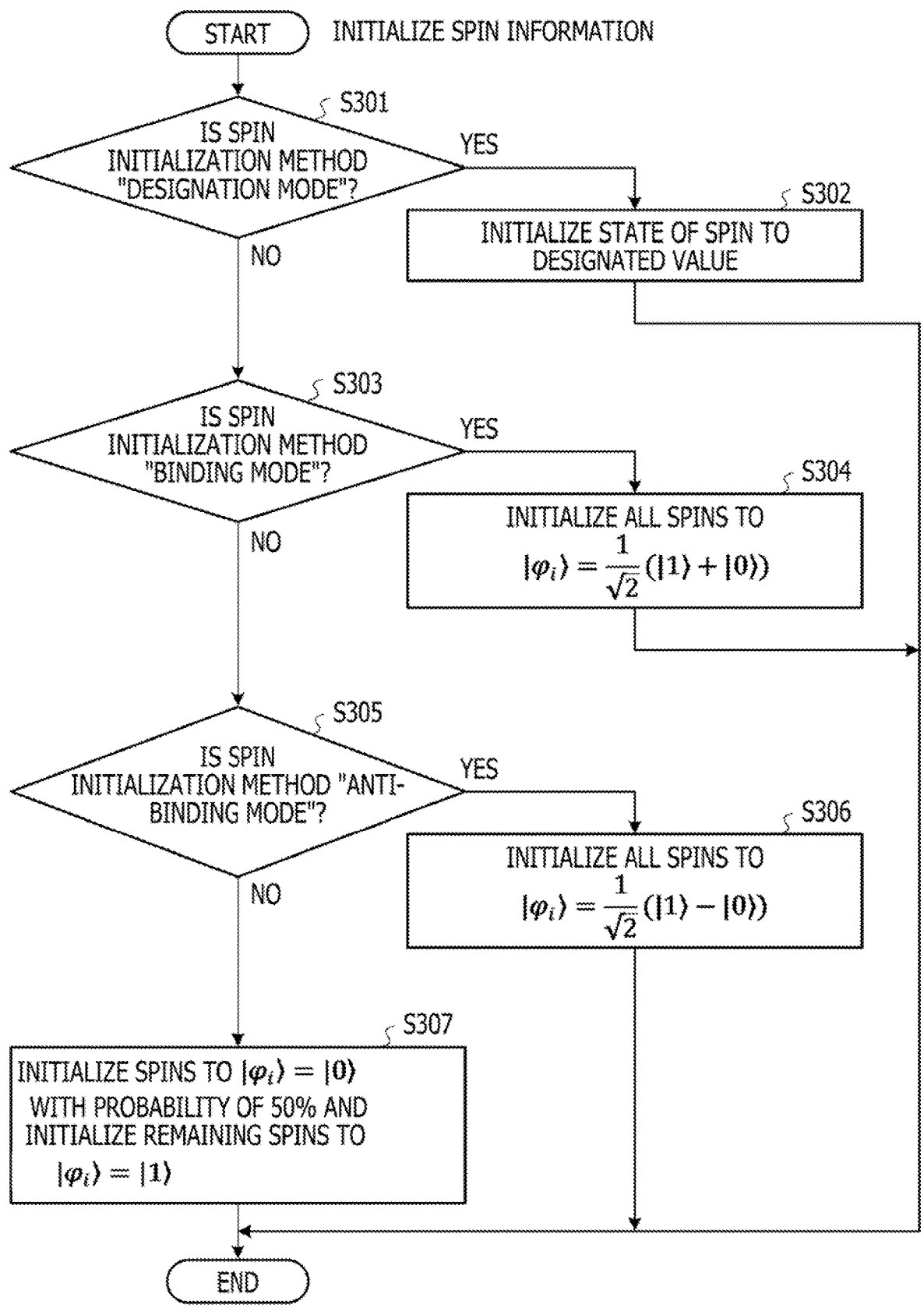
FIG. 7 is a flowchart illustrating an example of a procedure of a spin information initialization process.

FIG. 7 is a flowchart illustrating an example of a procedure of the spin information initialization process. Hereinafter, the process illustrated in FIG. 7 will be described along step numbers.

[Step S301] The spin initialization portion 123 determines whether or not a spin initialization method is the designation mode. In a case of the designation mode, the spin initialization portion 123 causes the process to proceed to step S302. Furthermore, in a case where the designation mode is not set, the spin initialization portion 123 causes the process to proceed to step S303.

[Step S302] The spin initialization portion 123 initializes a state of a spin to a value designated by the user. For example, the spin initialization portion 123 initializes the state of the spin based on information regarding the state of the spin read from the storage unit 110. Thereafter, the spin initialization portion 123 finishes the spin information initialization process.

[Step S303] The spin initialization portion 123 determines whether or not a spin initialization method is the binding mode. In a case of the binding mode, the spin initialization portion 123 causes the process to proceed to Step S304. Furthermore, in a case where the binding mode is not set, the spin initialization portion 123 causes the process to proceed to step S305.

[Step S304] The spin initialization portion 123 initializes the state of the spin such that the binding mode is set. For example, the spin initialization portion 123 initializes states of all spins to "$|\varphi_i\rangle = 1/(2^{1/2})(|1\rangle+|0\rangle)$". Thereafter, the spin initialization portion 123 finishes the spin information initialization process.

[Step S305] The spin initialization portion 123 determines whether or not a spin initialization method is the anti-binding mode. In a case of the anti-binding mode, the spin initialization portion 123 causes the process to proceed to step S306. Furthermore, in a case where the anti-binding mode is not set, the spin initialization portion 123 causes the process to proceed to step S307.

[Step S306] The spin initialization portion 123 initializes the state of the spin such that the anti-binding mode is set. For example, the spin initialization portion 123 initializes states of all spins to "$|\varphi_i\rangle = 1/(2^{1/2})(|1\rangle-|0\rangle)$". Thereafter, the spin initialization portion 123 finishes the spin information initialization process.

[Step S307] The spin initialization portion 123 initializes the state of the spin such that the random mode is set. For example, the spin initialization portion 123 initializes spins selected with a probability of 50% among all spin states to "$|\varphi_i\rangle=|0\rangle$", and initializes the remaining spins to "$|\varphi_i\rangle=|1\rangle$". Thereafter, the spin initialization portion 123 finishes the spin information initialization process.

In the above-described way, the spin information may be initialized.

Next, the imaginary time propagation process will be described in detail.

Figure 8:
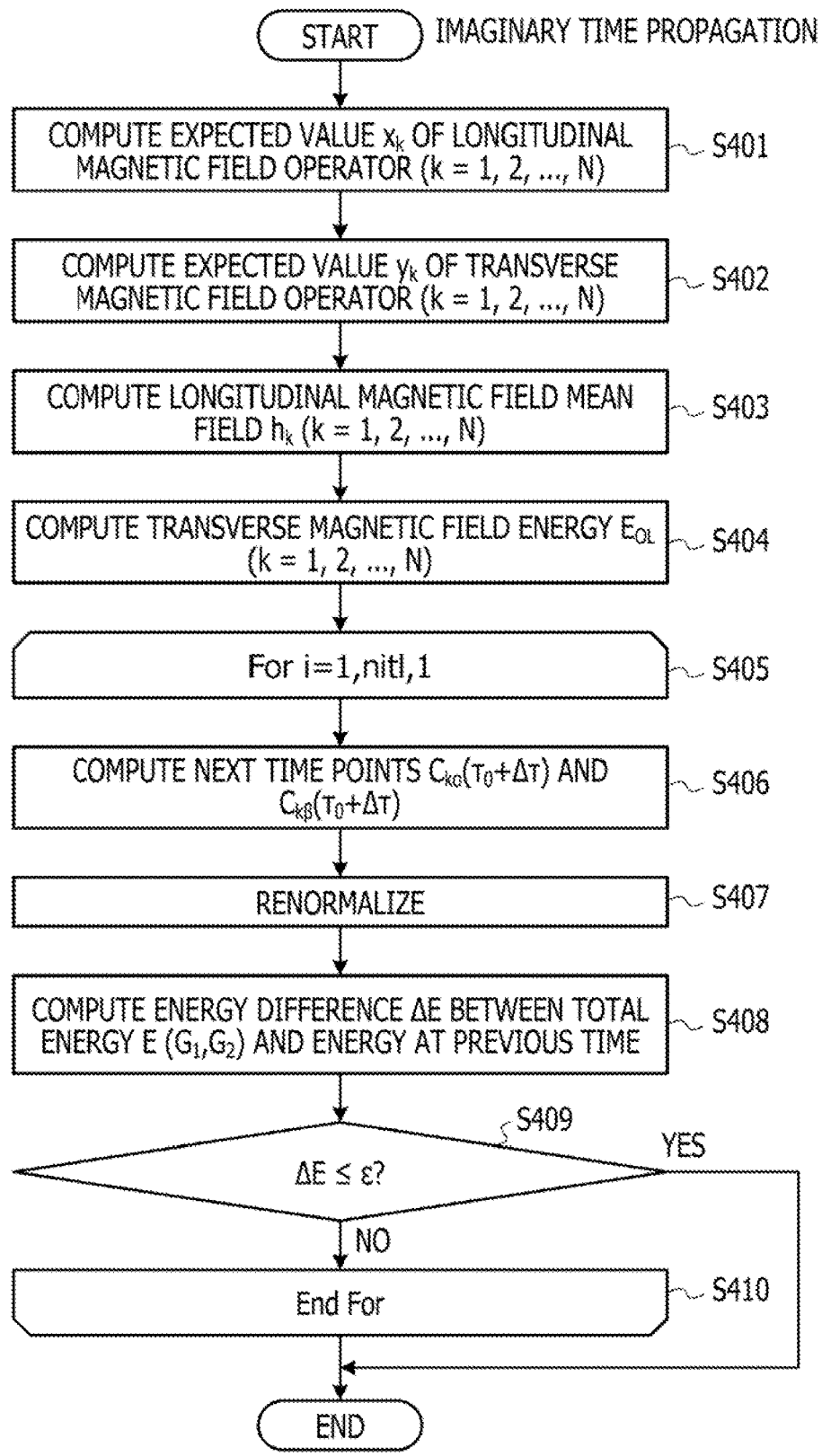
FIG. 8 is a flowchart illustrating an example of a procedure of an imaginary time propagation process.

FIG. 8 is a flowchart illustrating an example of a procedure of the imaginary time propagation process. Hereinafter, the process illustrated in FIG. 8 will be described along step numbers. In addition, the following description, a symbol indicating a number of a spin appearing in the above equation is replaced with k from i.

[Step S401] The imaginary time propagation control portion 126 computes expected values $x_k$ of the longitudinal magnetic field operator for all of the spins based on Equation (4-14) (where k=1, 2, . . . , and N).

[Step S402] The imaginary time propagation control portion 126 computes expected values $y_k$ of the transverse magnetic field operator for all of the spins based on Equation (4-15) (where k=1, 2, . . . , and N).

[Step S403] The imaginary time propagation control portion 126 computes the longitudinal magnetic field mean field $h_k$ for all of the spins based on Equation (4-32) (where k=1, 2, . . . , and N).

[Step S404] The imaginary time propagation control portion 126 computes the transverse magnetic field energy $E_{OL}$ based on Equation (4-31).

[Step S405] The imaginary time propagation control portion 126 repeatedly executes the processes in steps S406 to S409 until an end condition is satisfied. For example, the imaginary time propagation control portion 126 sets a preset number of times of repeated computation to nitl. In addition, the control portion 121 sequentially counts up a variable i indicating the number of times of imaginary time propagation from 1 by one whenever the processes in steps S406 to S409 are executed once. While a value of i is equal to or smaller than nitl, the control portion 121 repeatedly executes the processes in steps S406 to S409.

[Step S406] The imaginary time propagation control portion 126 computes the next time points $C_{k\alpha}(\tau_0+\Delta\tau)$ and $C_{k\beta}(\tau_0+\Delta\tau)$ (time points after the imaginary time is advanced by $\Delta\tau$) based on Equation (7-11).

[Step S407] The imaginary time propagation control portion 126 performs renormalization based on Equation (7-30).

[Step S408] The imaginary time propagation control portion 126 computes a difference $\Delta E$ between total energy $E(G_1, G_2)$ based on Equation (4-26) and total energy at the previous time.

[Step S409] The imaginary time propagation control portion 126 determines whether or not the difference $\Delta E$ with the total energy at the previous time is equal to or less than computation discontinuation accuracy $\varepsilon$. In a case where $\Delta E$ is equal to or less than $\varepsilon$, the imaginary time propagation control portion 126 finishes the imaginary time propagation process.

[Step S410] The imaginary time propagation control portion 126 finishes the imaginary time propagation process in a case where the end condition for the repetitive process is satisfied. For example, the imaginary time propagation control portion 126 determines that the end condition is satisfied in a case where a value of i is the same as nitl at the end of the process in step S409.

In the above-described way, the optimization apparatus 100 solves the optimization problem according to the QTSA method. Hereinafter, specific solution examples will be described.

It is assumed that $\Delta\tau=0.001$ and $G_1=1$ are set as time parameters of imaginary time propagation in the optimization apparatus 100. Furthermore, $G_2(0)=1$ and $G_2(n)=0$ (where n is the number of repetitions of the real time propagation) are defined in the optimization apparatus 100. Further, it is assumed that $G_2(i)=i/n$ (where i is an integer of 0 or more and n or less) is defined in the optimization apparatus 100.

As a computation procedure, the optimization apparatus 100 sets a value of $G_2(i)$, then performs imaginary time propagation by fixing the set $G_2(i)$, and performs computation until energy converges. The optimization apparatus 100 performs computation until the i-th step energy satisfies $\delta E=|E(G_1,G_2,i)-E(G_1,G_2,i-1)|<\varepsilon$ in the imaginary time propagation with the computation discontinuation accuracy $\varepsilon=1.0\times10^{-6}$, and continuously performs the computation until the energy sufficiently attenuates. When an energy change amount is equal to or less than the discontinuation error, the optimization apparatus 100 preserves a set of wave functions $\{C_{m\alpha}, C_{m\beta}\}$ at that time, and obtains a value of $G_2(i+1)$. In addition, the optimization apparatus 100 performs imaginary time propagation with an initial state of $G_2(i+1)$ as $\{C_{m\alpha}, C_{m\beta}\}$. The optimization apparatus 100 continues this operation until $G_2(i)=0$.

Here, a case where a traveling salesman problem (TSP) is solved by the optimization apparatus 100 is considered. In order to describe that an algorithm of the QTSA method functions correctly, it is assumed that a 3-city or 4-city TSP is solved first. With such the number of cities, an analysis solution is easily obtained.

Figure 9:
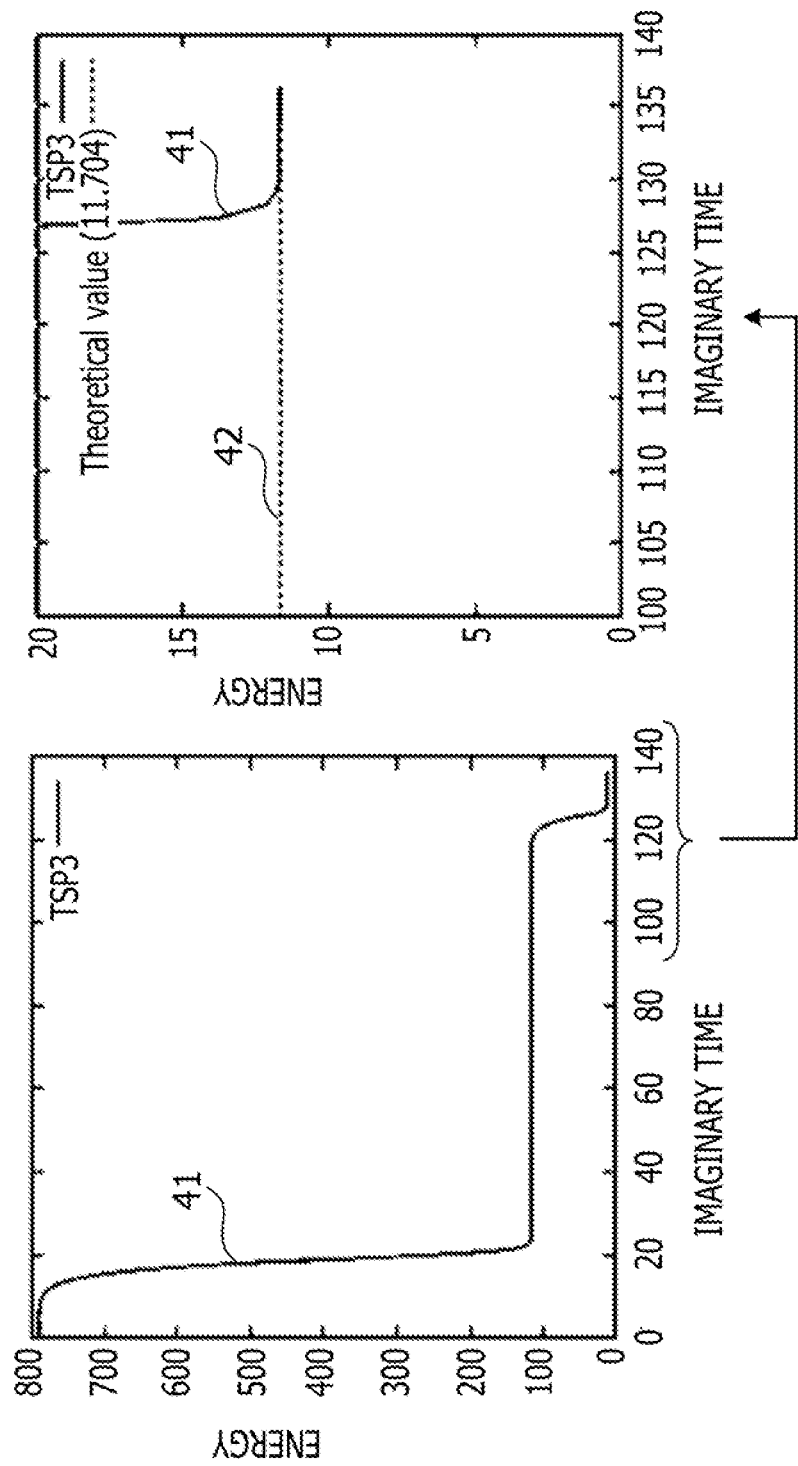
FIG. 9 illustrates an example of imaginary time propagation of energy.

FIG. 9 illustrates an example of imaginary time propagation of energy. FIG. 9 illustrates a state of a temporal change of energy obtained by solving Schrödinger equations (Equation (7-2) and Equation (7-3)) in imaginary time for the 3-city TSP. In FIG. 9, a change in energy due to imaginary time propagation is indicated by a solid line 41. Furthermore, a predetermined value theoretically obtained is indicated by a dotted line 42.

The 3-city TSP has city coordinates of (−1,0), (4,0), and (0,2). When the TSP is converted into the Ising model, the minimum value of energy gives the minimum path. In a case of this TSP, the minimum energy is $5+3\times5^{1/2}\approx11.708$. Assuming the number of cities is M at the conversion into the Ising model, the number of spins is $M^2$. Therefore, this problem is defined as an Ising model in a 9-spin system.

In the example illustrated in FIG. 9, a spin "1" is set as an initial state. As illustrated in FIG. 9, the energy decreases stepwise as the imaginary time propagation progresses. Moreover, the energy finally converges while gradually approaching near "11.708". "11.708" is the energy in the ground state of the quantum system Ising model, and is the minimum path of the traveling salesman problem. In addition, a portion where the energy rapidly decreases indicates that inversion of the spin direction occurs. Since a plurality of spins are inverted in cooperation, the energy rapidly decreases.

Figure 10:
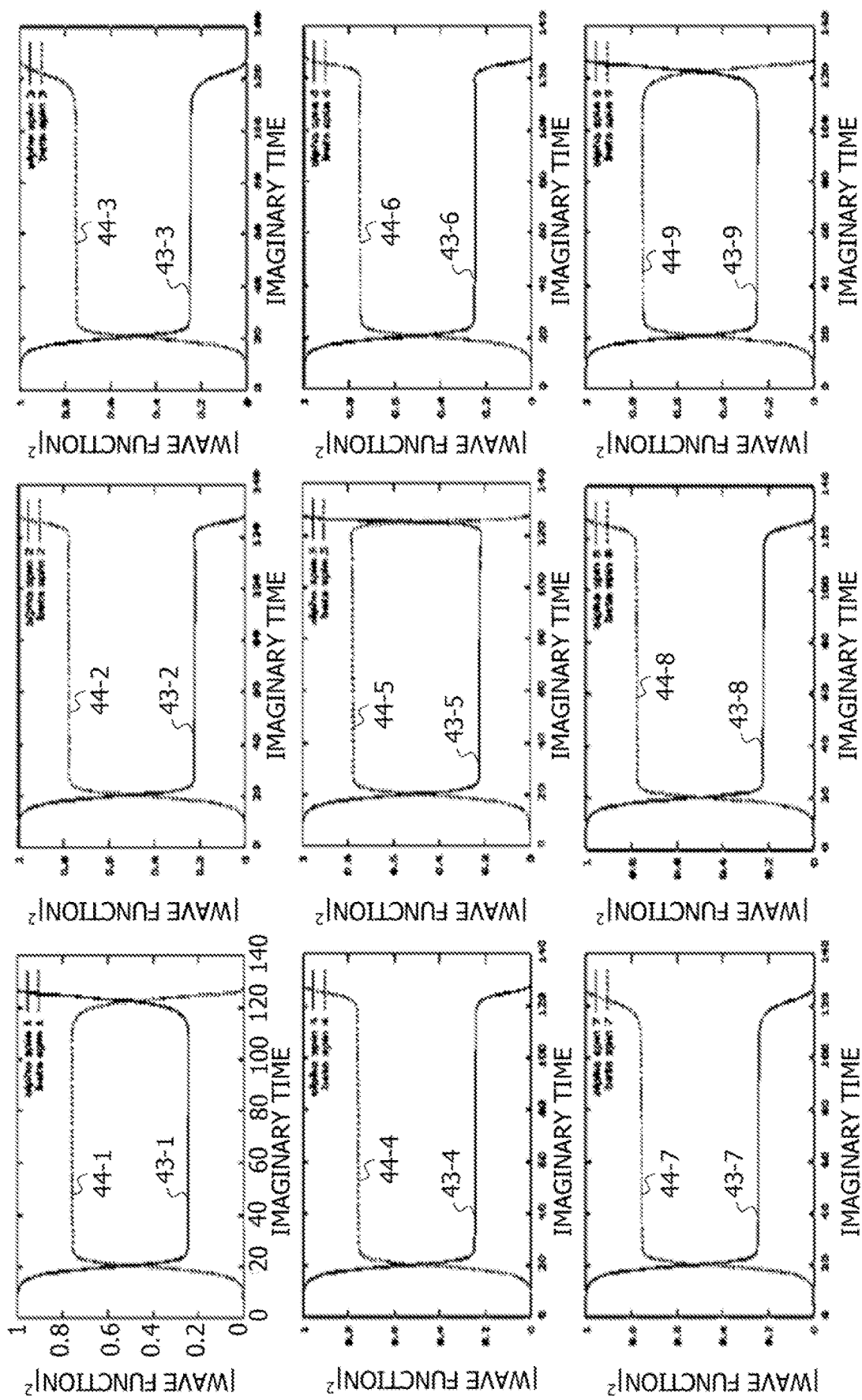
FIG. 10 illustrates an example of time propagation of a spin wave function.

FIG. 10 illustrates an example of time propagation of a spin wave function. FIG. 10 illustrates time propagation of wave functions of nine spins in the 3-city TSP. In a graph for each spin illustrated in FIG. 10, a transverse axis expresses imaginary time, and a longitudinal axis expresses the square of an absolute value of the wave function (observation probability). A solid line 43 (i.e., 43-1, 43-2, 43-3, 43-4, 43-5, 43-6, 43-7, 43-8, and 43-9) in each graph represents an observation probability of the state of |1>, and a dotted line 44 (i.e., 44-1, 44-2, 44-3, 44-4, 44-5, 44-6, 44-7, 44-8, and 44-9) in each graph represents an observation probability of the state of |0>.

From FIG. 10, it may be seen that a value of the spin converges to "0" or "1" as the imaginary time propagation progresses. It may be seen that values of the final states up to the nine spins read from the graphs are "1, 0, 0, 0, 1, 0, 0, 0, and 1". A set of three spins from the head represents a city to be visited. In other words, when a first spin in three sets is "1", a city 1 is a visit destination, when a second spin is "1", a city 2 is a visit destination, and, when a third spin is "1", a city 3 is a visit destination. The visit destination indicated by the three sets of spins closer to the head is earlier in the visiting order. The visiting order corresponding to the values "1, 0, 0, 0, 1, 0, 0, 0, and 1" of the spins is the cities 1, 2, and 3.

Since there are $2^N$ ($2^9=512$) solutions in the classical system, it is understood that the solution to the problem is deterministically reached starting from an obvious spin initial state.

In this case, there are features in a method of reducing energy and a method of changing a spin. When energy decreases in the imaginary time propagation, there are two time periods in which the energy rapidly decreases in a short time. Initially, all the spins are "1", and all the spins change in the same manner in cooperation, and energy decreases. This corresponds to the fact that when the transverse magnetic field is strong in the initial state, the influence of the transverse magnetic field is large, and all spins are almost equivalent to each other. This is because, when the Hamiltonian has only the transverse magnetic field term, the Hamiltonian is the same even when the i-th spin and the j-th spin are exchanged. In this case, the system has high symmetry. As the imaginary time propagation progresses, the transverse magnetic field term becomes weak, and the influence of the longitudinal magnetic field becomes strong. Thus, the Hamiltonian of the system is not symmetric with respect to the spin exchange, the symmetry of the spin exchange is suddenly broken when the magnetic field becomes weak to some extent, and the spin arrangement simultaneously changes, so that the Hamiltonian converges to the ground state of the system.

In the imaginary time propagation, as described above, a sudden decrease in energy without rearrangement of spins and a sudden decrease in energy with simultaneous rearrangement of spins occur. However, this problem has only one solution candidate for the TSP.

Thus, the solution example of the 3-city TSP does not indicate that another solution candidate is not selected. Therefore, the problem is expanded to a 4-city TSP.

Figure 11:
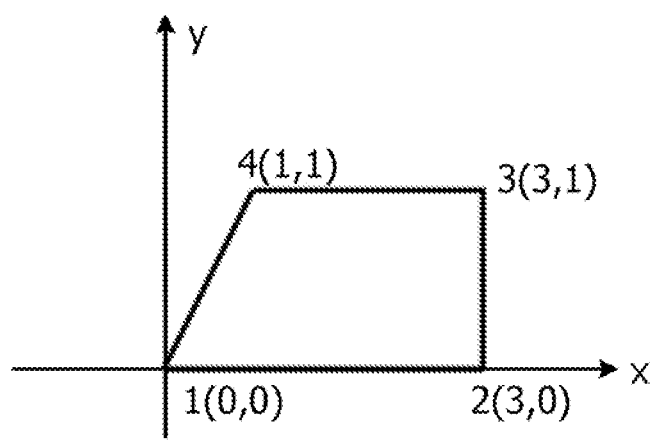
FIG. 11 illustrates an example of a 4-city TSP.

FIG. 11 illustrates an example of the 4-city TSP. In the example illustrated in FIG. 4, respective coordinates of cities are a city 1 (0,0), a city 2 (3,0), a city 3 (3,1), and a city 4 (1,1).

There are three solution candidates to the TSP, such as "7.414", "7.812", and "10.398" in ascending order. A result obtained by solving the TSP defined by the four cities as a quantization Ising problem by using the optimization apparatus 100 will be described below.

Figure 12:
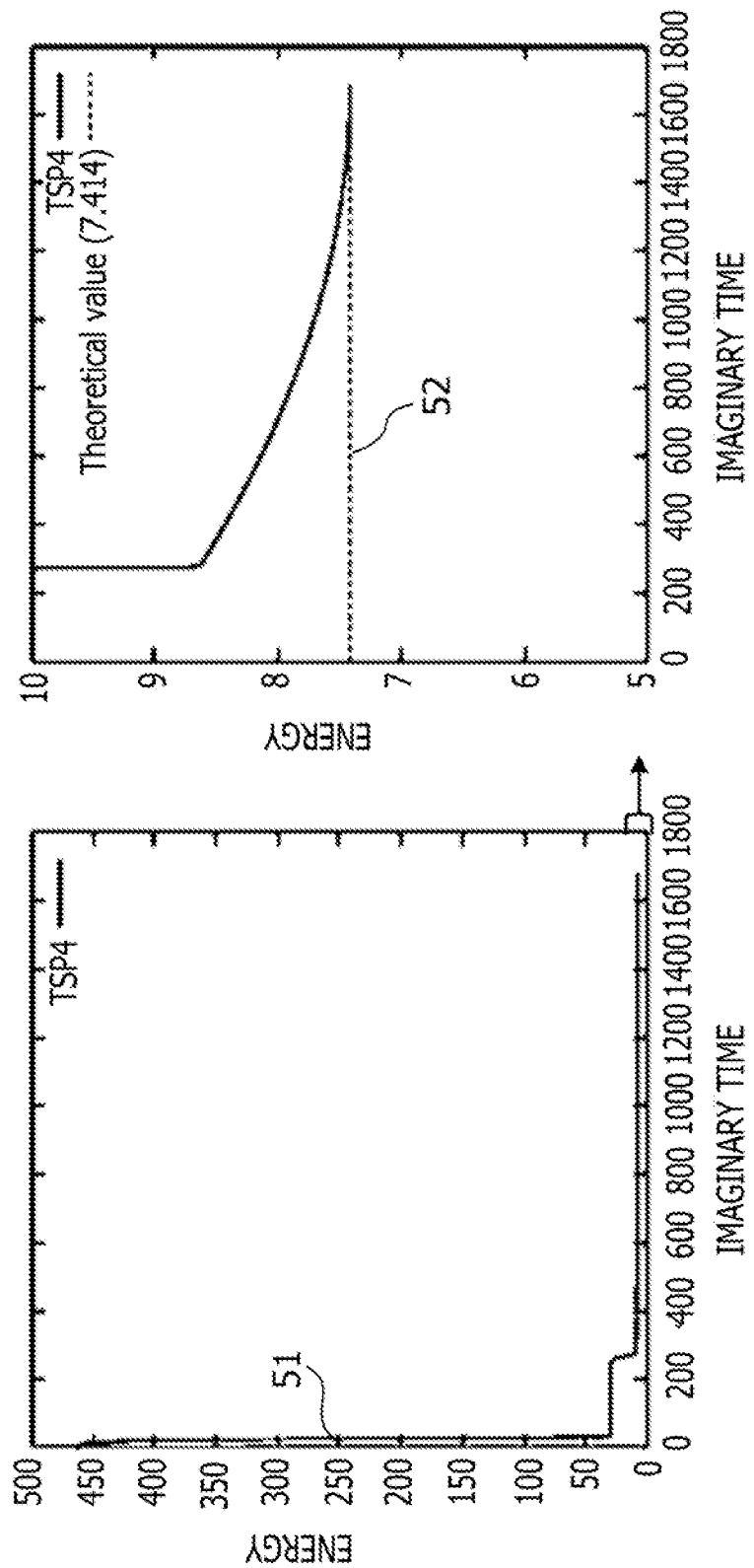
FIG. 12 illustrates an example of imaginary time propagation of energy in the 4-city TSP.

FIG. 12 illustrates an example of imaginary time propagation of energy in the 4-city TSP. In FIG. 12, a change in energy due to imaginary time propagation is indicated by a solid line 51. Furthermore, a predetermined value theoretically obtained is indicated by a dotted line 52. The energy in the 4-city TSP follows a slightly more complicated change than in the example of the 3-city TSP, but eventually gradually approaches a certain value. A value thereof is "7.414". It may be seen that the energy also gradually approaches energy in the ground state in the 4-city TSP.

Figure 13:
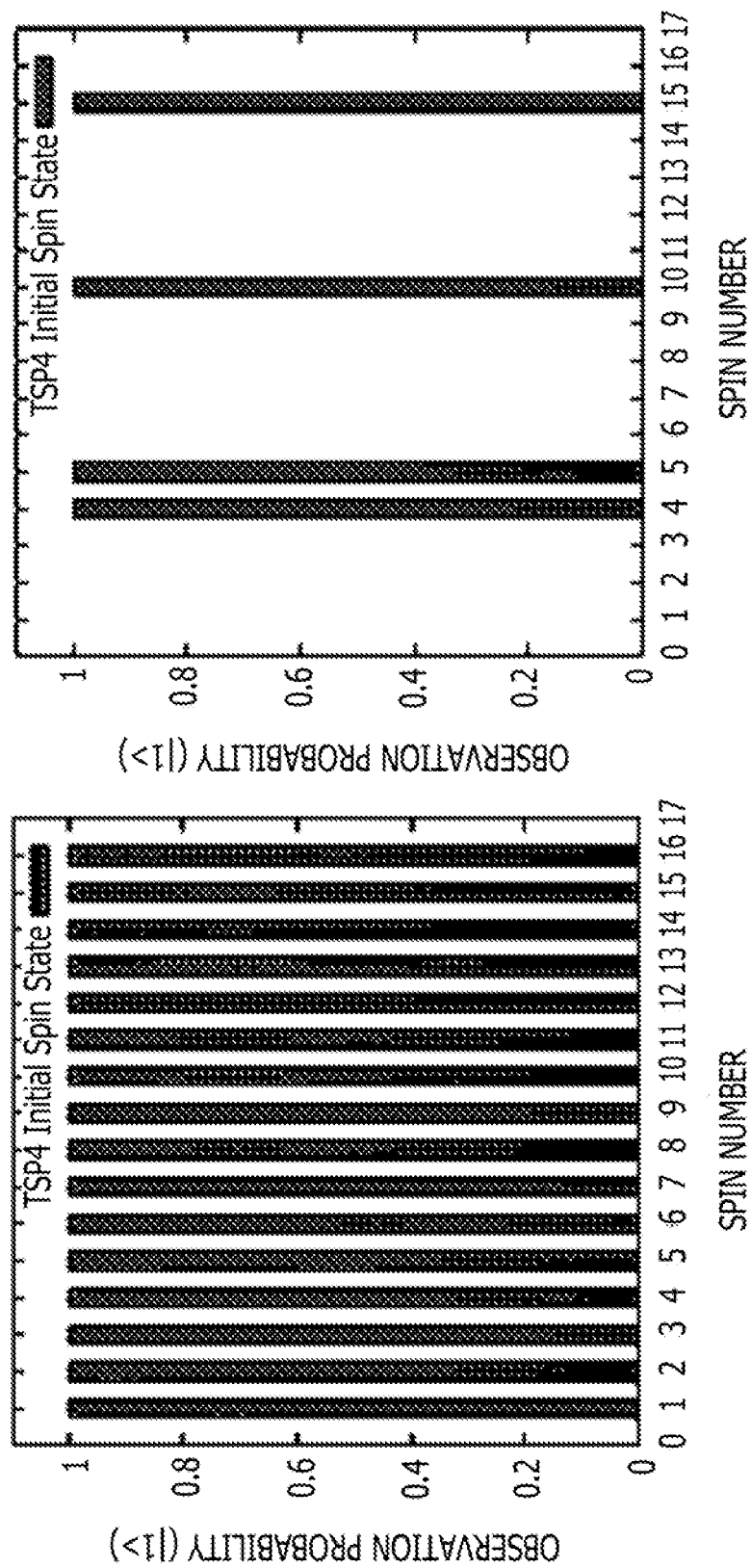
FIG. 13 illustrates an observation probability of a spin state |1> in an initial state and a final state of the 4-city TSP.

FIG. 13 illustrates an observation probability of the spin state |1> in an initial state and a final state of the 4-city TSP. In FIG. 13, the left part is a bar graph illustrating the initial state, and the right part is a bar graph illustrating the final state.

In the initial state, all spins are initialized to |1>. As a result of imaginary time propagation (quantum temperature annealing) and QA (transverse magnetic field annealing), a spin state illustrated on the right part of FIG. 13 is obtained. As the imaginary time propagation progresses, the spin is inverted. Finally, "0, 0, 0, 1, 1, 0, 0, 0, 0, 1, 0, 0, 0, 0, 1, and 0" are obtained, A city to be visited is indicated by a set of four spins from the head of 16 spins. For example, the first four spins represent a city visited first, and the next four spins represent a city visited in second. In the example illustrated in FIG. 13, the order of the city 4, the city 1, the city 2, and the city 3 is illustrated as the visiting order. Consequently, it may be seen that the minimum solution to the problem is certainly reached. In addition, although the departing city is arbitrary, which city is selected as a departure point of a trip is not a fundamental difference in the case of the TSP. Although one of the spin states degenerated to four states is selected in terms of quantum mechanics, another solution is easily obtained from one solution.

In addition, the above solution process may be realized by causing a Neumann type computer to execute a program. Further, there are N independent differential equations (differentiated ones) solved according to the QTSA method, which are highly independent algorithms and have many linear algebraic operations. Thus, parallel processes using a superscalar computer are easy.

OTHER EMBODIMENTS

The optimization apparatus 100 described in the second embodiment may compute an optimum solution based on the QTSA method by giving a coefficient of an optimization problem defined in the Ising type. Thus, the optimization apparatus 100 may compute an optimum solution without depending on a field or a business type to which the problem belongs as long as the optimization problem may be defined in the Ising type. For example, the optimization apparatus 100 may solve a minimum value solution problem in fields such as finance, distribution, material engineering, computational chemistry, and computational biology. Furthermore, the optimization apparatus 100 may solve the minimum value solution problem in a business type such as finance, distribution, and healthcare (pharmaceutical).

In the second embodiment, the optimization apparatus 100 is implemented by a Neumann type computer configured to include the processor 101 and the memory 102, but the optimization apparatus may be implemented by using, for example, a quantum computer. In this case, thermal dissipation in the optimization apparatus using the quantum computer may be phenomenologically incorporated into the optimization apparatus 100 by the Neumann type computer. Accordingly, the optimization apparatus 100 using the Neumann type computer may also be used as a simulator of hardware design of the optimization apparatus using the quantum computer.

As described above, the embodiments are exemplified, but the configuration of each unit described in the embodiments may be replaced with another unit having the same function. Furthermore, any other constituent components or processes may be added. Further, any two or more of the configurations (features) described in the embodiments may be combined with each other.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An optimization apparatus comprising:
a memory; and
a processor coupled to the memory, the processor being configured to perform processing upon attempting to solve a ground state of an Ising model by simulating a state change of the Ising model when a magnetic field applied to the Ising model is reduced, the Ising model representing a problem to be solved, the processing including:
executing a first process, the first process being a real time propagation in which an intensity of the magnetic field is reduced with progress of time in simulation; and
in response to the progress of time in the real time propagation of the first process, executing a second process, the second process including reducing energy of the Ising model based on an imaginary time propagation method;
wherein the second process is configured to renormalize a wave function representing the energy of the Ising model whenever the energy of the Ising model is reduced; and wherein combination of real time propagation and imaginary time propagation accelerate solution retrieval time.

2. The optimization apparatus according to claim 1, wherein
the executing of the second process is performed, whenever a real time in the real time propagation progresses, to cause a state of the Ising model to transition to a ground state corresponding to a magnetic field applied at that time point according to the imaginary time propagation method.

3. The optimization apparatus according to claim 1, wherein
the second process is configured to determine a step width of an imaginary time that progresses according to the imaginary time propagation method based on a value of a variable by which the step width of the imaginary time is multiplied in computation in the imaginary time propagation method.

4. A non-transitory computer-readable storage medium for storing an optimization program which causes a processor to perform processing upon attempting to solve a ground state of an Ising model by simulating a state change of the Ising model when a magnetic field applied to the Ising model is reduced, the Ising model representing a problem to be solved, the processing including:
executing a first process, the first process being a real time propagation in which an intensity of the magnetic field is reduced with progress of time in simulation; and
in response to the progress of time in the real time propagation of the first process, executing a second process, the second process including reducing energy of the Ising model based on an imaginary time propagation method;
wherein the second process is configured to renormalize a wave function representing the energy of the Ising model whenever the energy of the Ising model is reduced; and wherein combination of real time propagation and imaginary time propagation accelerate solution retrieval time.

5. An optimization method executed by a computer upon attempting to solve a ground state of an Ising model by simulating a state change of the Ising model when a magnetic field applied to the Ising model is reduced, the Ising model representing a problem to be solved, the method comprising:
executing a first process, the first process being a real time propagation in which an intensity of the magnetic field is reduced with progress of time in simulation; and
in response to the progress of time in the real time propagation of the first process, executing a second process, the second process including reducing energy of the Ising model based on an imaginary time propagation method;

wherein the second process is configured to renormalize a wave function representing the energy of the Ising model whenever the energy of the Ising model is reduced; and wherein combination of real time propagation and imaginary time propagation accelerate solution retrieval time.

\* \* \* \* \*